United States Patent
Koyama et al.

(10) Patent No.: US 8,941,617 B2
(45) Date of Patent: Jan. 27, 2015

(54) IMAGE INPUT-OUTPUT DEVICE WITH COLOR LAYER BETWEEN PHOTODETECTOR AND DISPLAY ELEMENTS TO IMPROVE THE ACCURACY OF READING IMAGES IN COLOR

(75) Inventors: Jun Koyama, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1050 days.

(21) Appl. No.: 12/604,906

(22) Filed: Oct. 23, 2009

(65) Prior Publication Data

US 2010/0117991 A1 May 13, 2010

(30) Foreign Application Priority Data

Nov. 7, 2008 (JP) ................. 2008-286043

(51) Int. Cl.
*G06F 3/042* (2006.01)
*H01L 31/0232* (2014.01)
(Continued)

(52) U.S. Cl.
CPC ............ *G06F 3/042* (2013.01); *G02F 1/13338* (2013.01); *G06F 3/0412* (2013.01); *H01L 27/3234* (2013.01); *H01L 31/02162* (2013.01); *G02F 1/133514* (2013.01); *G02F 2001/13312* (2013.01); *G02F 2001/136222* (2013.01); *H01L 27/14678* (2013.01); *H01L 27/3213* (2013.01); *H01L 27/332* (2013.01); *H01L 27/326* (2013.01); *H01L 2227/323* (2013.01)
USPC ..... 345/175; 345/156; 178/18.01; 178/18.02; 178/18.03; 178/18.04; 178/18.05; 178/18.06; 178/18.07; 178/18.08; 178/18.09; 178/18.11; 178/19.01; 178/19.02; 178/19.03; 178/19.04; 178/19.05; 250/14.1; 250/226; 349/12

(58) Field of Classification Search
CPC ...................................................... G06F 3/042
See application file for complete search history.

(56) References Cited

U.S. PATENT DOCUMENTS 6,747,290 B2  6/2004 Yamazaki et al.
6,747,638 B2  6/2004 Yamazaki et al.
(Continued)

FOREIGN PATENT DOCUMENTS

CN          1448759      10/2003
CN       001332366 C    8/2007
(Continued)

OTHER PUBLICATIONS

Chinese Office Action (Application No. 200910220866.2), dated Mar. 13, 2013.
(Continued)

*Primary Examiner* — Joseph Feild
*Assistant Examiner* — K. Kiyabu
(74) *Attorney, Agent, or Firm* — Nixon Peabody LLP; Jeffrey L. Costellia

(57) ABSTRACT

An image input-output device includes a pixel which displays an image and reads an image. The pixel includes a photodetector element, a color layer, and a display element. The color layer is provided over the photodetector element and the display element is provided over the color layer, so that the distance between the photodetector element and the color layer is reduced. Accordingly, light is likely to enter the predetermined photodetector element through the predetermined color layer, and thus, even a color object can be read correctly.

21 Claims, 19 Drawing Sheets

(51) Int. Cl.
*H01L 27/144* (2006.01)
*H01L 31/101* (2006.01)
*G02F 1/1335* (2006.01)
*G02F 1/1333* (2006.01)
*G06F 3/041* (2006.01)
*H01L 27/32* (2006.01)
*H01L 31/0216* (2014.01)
*G02F 1/133* (2006.01)
*G02F 1/1362* (2006.01)
*H01L 27/146* (2006.01)

(56) References Cited

U.S. PATENT DOCUMENTS

| | | | |
|---|---|---|---|
| 6,798,472 | B2 | 9/2004 | Nagae |
| 6,972,753 | B1 | 12/2005 | Kimura et al. |
| 7,030,551 | B2 | 4/2006 | Yamazaki et al. |
| 7,242,449 | B1 | 7/2007 | Yamazaki et al. |
| 7,525,523 | B2 | 4/2009 | Yamazaki et al. |
| 7,755,711 | B2 | 7/2010 | Kenmochi et al. |
| 8,053,816 | B2 | 11/2011 | Arao et al. |
| 8,456,459 | B2 | 6/2013 | Yamazaki et al. |
| 2002/0011972 | A1* | 1/2002 | Yamazaki et al. ........... 345/74.1 |
| 2002/0056838 | A1 | 5/2002 | Ogawa |
| 2003/0057419 | A1 | 3/2003 | Murakami et al. |
| 2005/0189546 | A1* | 9/2005 | Yasukawa et al. .............. 257/79 |
| 2006/0007165 | A1 | 1/2006 | Yang et al. |
| 2006/0017862 | A1 | 1/2006 | Song et al. |
| 2006/0066537 | A1 | 3/2006 | Kimura et al. |
| 2006/0109260 | A1 | 5/2006 | Sui et al. |
| 2006/0262055 | A1 | 11/2006 | Takahara |
| 2007/0210344 | A1* | 9/2007 | Arao et al. ................... 257/232 |
| 2008/0030633 | A1 | 2/2008 | Tsai et al. |
| 2009/0101948 | A1 | 4/2009 | Park et al. |
| 2009/0295769 | A1 | 12/2009 | Yamazaki et al. |
| 2010/0033450 | A1 | 2/2010 | Koyama et al. |
| 2010/0085331 | A1 | 4/2010 | Kurokawa et al. |
| 2012/0086006 | A1 | 4/2012 | Arao et al. |
| 2013/0207125 | A1 | 8/2013 | Yamazaki et al. |

FOREIGN PATENT DOCUMENTS

| | | |
|---|---|---|
| CN | 101034723 | 9/2007 |
| CN | 101090139 | 12/2007 |
| CN | 101211083 | 7/2008 |
| EP | 1 939 675 A2 | 7/2001 |
| EP | 1 122 792 A2 | 8/2001 |
| EP | 1209748 A | 5/2002 |
| JP | 07-099297 | 4/1995 |
| JP | 2000-330090 | 11/2000 |
| JP | 2001-109394 | 4/2001 |
| JP | 2006-005404 | 1/2006 |
| JP | 2006-503333 | 1/2006 |
| JP | 2007-033789 | 2/2007 |
| JP | 2007-102154 | 4/2007 |
| TW | 588209 | 5/2004 |
| WO | WO-2004/036484 A1 | 4/2004 |

OTHER PUBLICATIONS

Chinese Office Action (Application No. 200910220866.2), dated May 19, 2014.

Taiwanese Office Action (Application No. 98136699), dated Oct. 27, 2014.

* cited by examiner

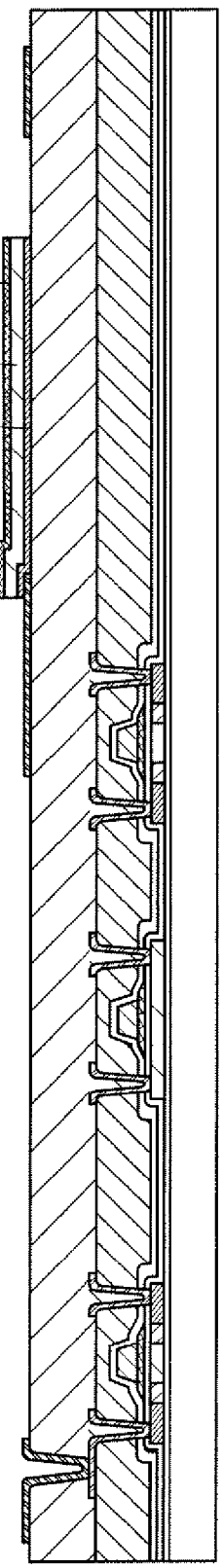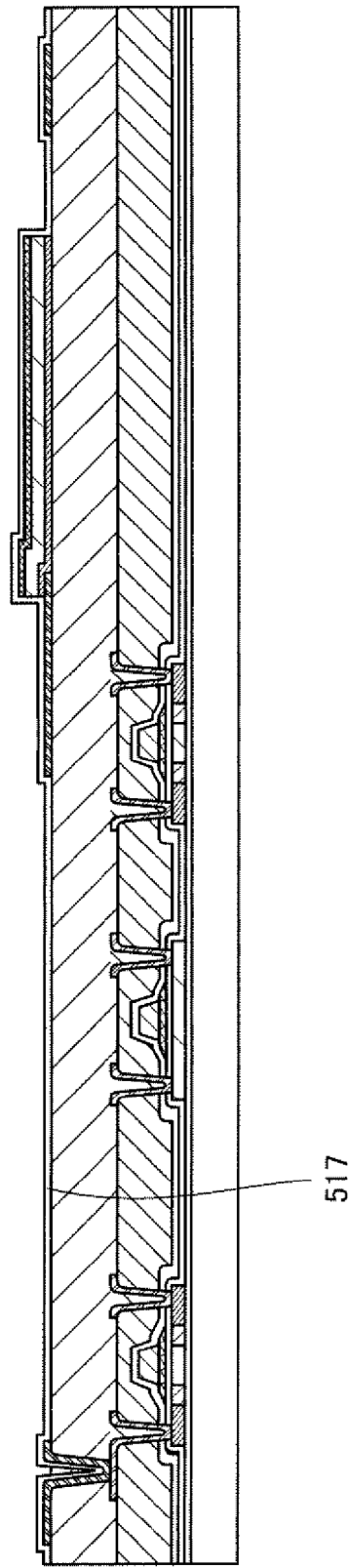
FIG. 13A
FIG. 13B

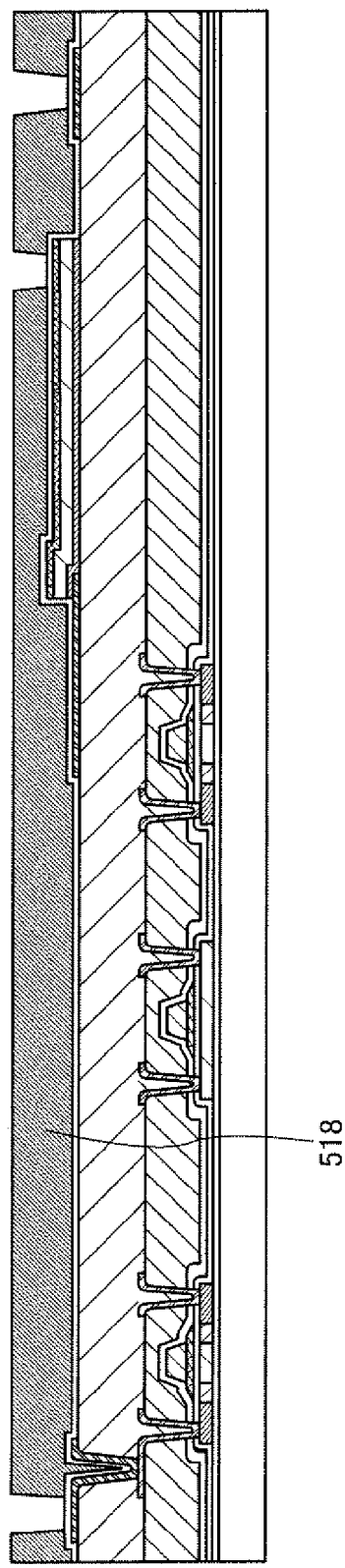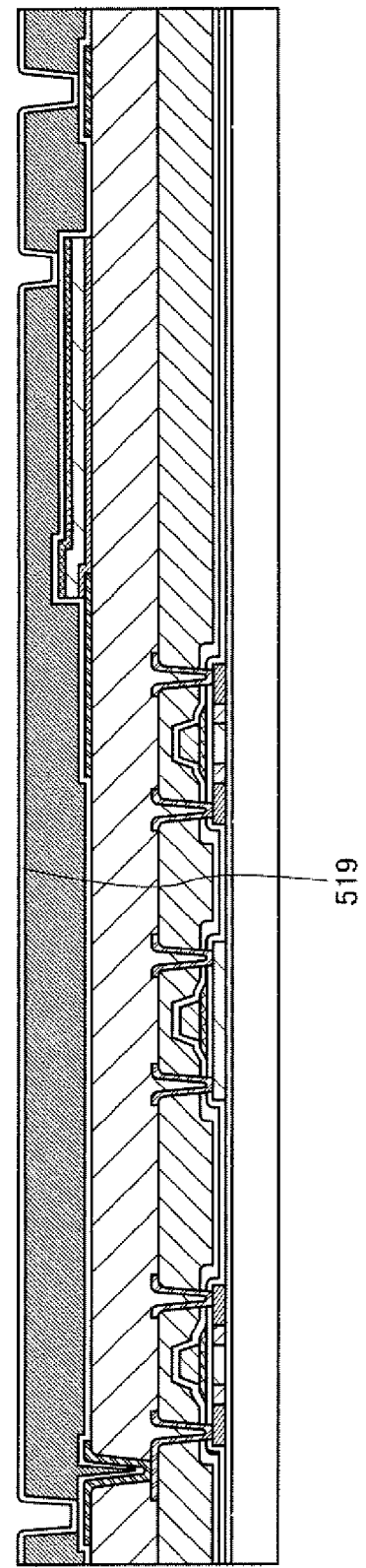

IMAGE INPUT-OUTPUT DEVICE WITH COLOR LAYER BETWEEN PHOTODETECTOR AND DISPLAY ELEMENTS TO IMPROVE THE ACCURACY OF READING IMAGES IN COLOR

BACKGROUND OF THE INVENTION

1. Field of the Invention

The present invention relates to an image input-output device having functions of inputting and outputting images.

2. Description of the Related Art

In recent years, a device having a display (output) function and a read (input) function (hereinafter referred to as an image input-output device) is known as a multifunctional device obtained by adding another function to a display device such as a liquid crystal display device.

An image input-output device includes a display element and a photodetector element in a pixel portion, performs display operation using the display element, and can read an object to be read (e.g., a finger, a pen, or a document) using the photodetector element. With this structure, the image input-output device can have, for example, a function of a touch panel, such as functions of detecting position and inputting and outputting text, a fingerprint identification function, and functions of performing read operation like a scanner and displaying a read image on a display portion. Moreover, when a color filter (also referred to as a color layer), for example, is used for read operation, an object is read in color and can be displayed in full color (e.g., see Patent Document 1).

[Reference]

Patent Document 1: Japanese Published Patent Application No. 2007-033789

SUMMARY OF THE INVENTION

A conventional image input-output device disclosed in Patent Document 1 includes a display element and a light receiving element (also referred to as a photodetector element) in a pixel. One of substrates (a TFT substrate) is provided with the display element and the light receiving element. The other substrate (a counter electrode substrate) is provided with a color layer (a color filter). The two substrates are attached to each other. When one substrate is considered as the bottom, the color layer is placed above the display element. With such a structure, the display element is placed between the color layer and the light receiving element with a certain distance between the color layer and the light receiving element; accordingly, it is highly possible that incident light at the time of reading enters the light receiving element without passing through the color layer. When incident light enters the light receiving element without passing through the color layer, the color of an object cannot be read correctly. Accordingly, a conventional image input-output device has a problem of low reading accuracy.

In view of the foregoing problem, an object of one embodiment of the present invention is to improve the accuracy of reading images, and particularly the accuracy of reading images in color.

One embodiment of the invention disclosed in this specification is an image input-output device including a pixel which displays an image and reads an image. The pixel includes a photodetector element, a color layer, and a display element. The color layer is provided over the photodetector element and the display element is provided over the color layer, so that the distance between the photodetector element and the color layer is reduced.

A structure of an image input-output device, which is one embodiment of the invention disclosed in this specification, is as follows. The image input-output device includes a pixel which displays an image and reads an image. The pixel includes a photodetector element, a color layer provided over the photodetector element, and a display element provided over the color layer.

Another structure of an image input-output device is as follows. The image input-output device includes a pixel which displays an image and reads an image. The pixel includes a first transistor and a second transistor; a photodetector element having an anode and a cathode, one of which is electrically connected to a gate electrode of the second transistor; a first protective film provided over the first transistor, the second transistor, and the photodetector element; a color layer provided over the first protective film; a second protective film provided over the color layer; and a liquid crystal element provided over the second protective film. The liquid crystal element includes a first electrode electrically connected to a source electrode or a drain electrode of the first transistor through an opening portion provided in the first protective film, the color layer, and the second protective film; a second electrode; and a liquid crystal layer to which a voltage is applied by the first electrode and the second electrode.

Another structure of an image input-output device is as follows. The image input-output device includes a pixel which displays an image and reads an image. The pixel includes a first transistor and a second transistor; a photodetector element having an anode and a cathode, one of which is electrically connected to a gate electrode of the second transistor; a first protective film provided over the first transistor, the second transistor, and the photodetector element; a light blocking layer provided over the first transistor or the second transistor with the first protective film therebetween; a color layer provided over part of the first protective film, where the light blocking layer is not provided; a second protective film provided over the light blocking layer and the color layer; and a liquid crystal element provided over the second protective film. The liquid crystal element includes a first electrode electrically connected to a source electrode or a drain electrode of the first transistor through an opening portion provided in the first protective film, the color layer, and the second protective film; a second electrode; and a liquid crystal layer to which a voltage is applied by the first electrode and the second electrode.

The photodetector element can include a first semiconductor layer having one of p-type conductivity and n-type conductivity; a second semiconductor layer which is provided over the first semiconductor layer and has a higher resistance than the first semiconductor layer; and a third semiconductor layer which is provided over the second semiconductor layer, and has the other of p-type conductivity and n-type conductivity and a lower resistance than the second semiconductor layer.

The photodetector element can include a semiconductor layer including a first semiconductor region having one of p-type conductivity and n-type conductivity; a second semiconductor region having a higher resistance than the first semiconductor region; and a third semiconductor region having the other of p-type conductivity and n-type conductivity and a lower resistance than the second semiconductor region.

Note that in this specification, terms with ordinal numbers, such as "first" and "second", are used in order to avoid confusion among components, and the terms do not limit the components numerically.

When the distance between the photodetector element and the color layer is reduced, light is likely to enter the photodetector element through the color layer. Accordingly, even a color object can be read correctly, and the reading accuracy can be improved.

BRIEF DESCRIPTION OF THE DRAWINGS

In the accompanying drawings:

FIGS. 13A and 13B are cross-sectional views illustrating an example of a method for manufacturing a pixel in an image input-output device in Embodiment 3;

FIGS. 14A and 14B are cross-sectional views illustrating an example of a method for manufacturing a pixel in an image input-output device in Embodiment 3;

DETAILED DESCRIPTION OF THE INVENTION

Embodiments of the invention disclosed in this specification will be described below with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments.

(Embodiment 1)

In this embodiment, an image input-output device, which is one embodiment of the invention disclosed in this specification, will be described.

Figure 1:
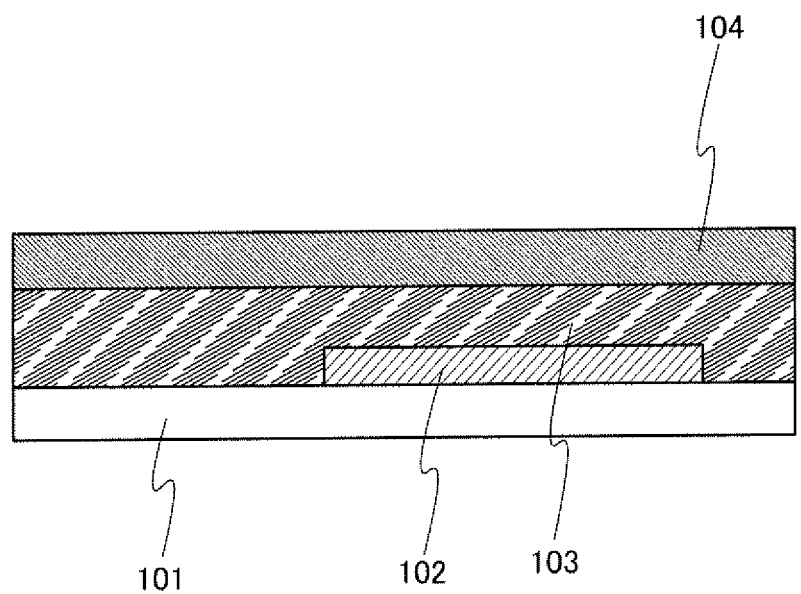
FIG. 1 is a cross-sectional view illustrating an example of a structure of a pixel in an image input-output device in Embodiment 1.

An image input-output device in this embodiment includes a pixel which displays an image and reads an image, and it is possible to perform image display (also referred to as output operation) and image reading (also referred to as input operation) in each pixel. A pixel structure will be described with reference to FIG. 1. FIG. 1 is a cross-sectional view illustrating an example of a structure of a pixel in the image input-output device in this embodiment.

The pixel illustrated in FIG. 1 includes a photodetector element 102 provided over a substrate 101, a color layer 103 provided over the photodetector element 102, and a display element 104 provided over the color layer 103.

Note that when it is explicitly described that B is provided (formed) on or over A, it does not necessarily mean that B is provided (formed) in direct contact with A. The description includes the case where A and B are not in direct contact with each other, that is, the case where another object is placed between A and B. Here, each of A and B corresponds to an object (e.g., an element, a wiring, an electrode, or a layer).

Accordingly, for example, when it is explicitly described that a layer B is provided (formed) on or over a layer A, the description includes both the case where the layer B is provided (formed) in direct contact with the layer A, and the case where another layer (e.g., a layer C or a layer D) is provided (formed) in direct contact with the layer A and the layer B is provided (formed) in direct contact with the layer C or the layer D. Note that another layer (e.g., the layer C or the layer D) may be a single layer or a plurality of layers.

As the substrate 101, a glass substrate, a quartz substrate, or a flexible substrate can be used, for example. The flexible substrate refers to a substrate which can be bent (is flexible). An example of the flexible substrate is a plastic substrate formed using polycarbonate, polyarylate, polyethersulfone, or the like. Alternatively, as the substrate 101, an attachment film (formed using polypropylene, polyester, vinyl, polyvinyl fluoride, vinyl chloride, or the like), paper of a fibrous material, a base material film (polyester, polyamide, an inorganic vapor deposition film, paper, or the like), or the like can be used.

The photodetector element 102 has a function of generating current in accordance with the illuminance of incident light, and is an element for reading an image. The photodetector element 102 can be formed using a photodiode or a phototransistor, for example.

The color layer 103 is also referred to as a color filter, and expresses a color by extracting light with a predetermined wavelength from incident light. A color layer of at least any of red (R), green (G), and blue (B) can be used as the color layer

103. Moreover, the color layer 103 can be formed by a photolithography method or an inkjet method, for example.

Further, in the image input-output device in this embodiment, the color layer 103 can also function as a planarization film. As illustrated in FIG. 1, over the substrate 101, difference in height occurs between a region including the photodetector element 102 and other regions. However, the provision of the color layer 103 can reduce, preferably eliminate, the difference in height.

Note that in the image input-output device in this embodiment, a protective film which prevents diffusion of impurities from the color layer 103 can be provided. The provision of the protective film can prevent a pigment or a dye in the color layer 103, for example, from diffusing into another layer.

The display element 104 performs display operation and can be formed using a liquid crystal element or an EL element, for example.

Next, operation of the image input-output device in this embodiment will be described using the image input-output device illustrated in FIG. 1 as an example.

The operation of the image input-output device in this embodiment is mainly classified into display operation and read operation. Each operation will be described below.

The display operation is as follows. Image data is input to a pixel, a voltage is applied to the display element 104 in the pixel based on the input image data, and the display element 104 performs the display operation in accordance with the applied voltage.

The read operation is as follows. A current is generated by the photodetector element 102 in accordance with the illuminance of incident light, and the generated current is used as image data, so that the read operation is performed. Note that since light enters the photodetector element 102 through the color layer 103, data of a color image is obtained by reading an object.

As described above, the image input-output device in this embodiment has a structure where the color layer is provided over the photodetector element, and the display element is provided over the color layer. This structure can reduce the distance between the photodetector element and the color layer, and can prevent light from entering, for example, a photodetector element on which light passing through a color layer of a predetermined color is to enter, through a color filter of a color other than the predetermined color. Accordingly, even a color object can be read correctly, and the reading accuracy can be improved.

(Embodiment 2)

In this embodiment, an image input-output device using a liquid crystal element as a display element will be described as one embodiment of the invention disclosed in this specification.

Figure 2:
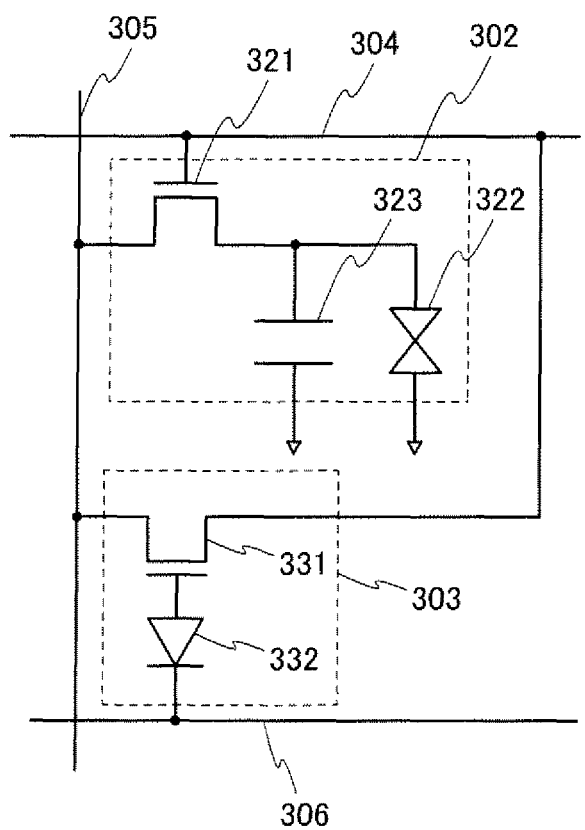
FIG. 2 is a circuit diagram illustrating an example of a circuit configuration of a pixel portion in an image input-output device in Embodiment 2.

First, a circuit configuration of a pixel in an image input-output device in this embodiment will be described with reference to FIG. 2. FIG. 2 is a circuit diagram illustrating an example of a circuit configuration of a pixel in the image input-output device in this embodiment.

As illustrated in FIG. 2, the pixel in the image input-output device in this embodiment is divided into a display circuit 302 and a photodetector circuit 303. The display circuit 302 includes a transistor 321, a liquid crystal element 322, and a capacitor 323. The photodetector circuit 303 includes a transistor 331 and a photodetector element 332.

Note that in this specification, a transistor has at least three terminals of a gate, a source, and a drain.

The gate is the entire gate electrode and gate wiring or part thereof. The gate wiring is a wiring for electrically connecting a gate electrode of at least one transistor to another electrode or another wiring, and includes a scan line in a display device in its category, for example.

The source is the entire source region, source electrode, and source wiring or part thereof. The source region indicates a region in a semiconductor layer, which has a resistivity lower than a given value and functions as the source of the transistor. The source electrode indicates part of a conductive layer, which is connected to the source region. The source wiring is a wiring for electrically connecting a source electrode of at least one transistor to another electrode or another wiring. For example, in the case where a signal line in a display device is electrically connected to a source electrode, the source wiring includes the signal line in its category.

The drain is the entire drain region, drain electrode, and drain wiring or part thereof. The drain region indicates a region in a semiconductor layer, which has a resistivity lower than a given value and functions as the drain of the transistor. The drain electrode indicates part of a conductive layer, which is connected to the drain region. The drain wiring is a wiring for electrically connecting a drain electrode of at least one transistor to another electrode or another wiring. For example, in the case where a signal line in a display device is electrically connected to a drain electrode, the drain wiring includes the signal line in its category.

In addition, in this specification, a source and a drain of a transistor change depending on the structure, the operating conditions, or the like of the transistor; therefore, it is difficult to define which terminal is the source and which terminal is the drain. Accordingly, in this specification, one terminal which is freely selected from the source and the drain is referred to as one of the source and the drain, whereas the other terminal is referred to as the other of the source and the drain.

A gate of the transistor 321 is electrically connected to a scan line 304, and one of a source and a drain of the transistor 321 is electrically connected to a signal line 305.

The liquid crystal element 322 has a first terminal and a second terminal. The first terminal is electrically connected to the other of the source and the drain of the transistor 321. A ground potential or a potential with a given value is supplied to the second terminal. The liquid crystal element 322 includes a first electrode which serves as part or all of the first terminal, a second electrode which serves as part or all of the second terminal, and a layer including liquid crystal molecules whose transmittance is changed by applying voltage between the first electrode and the second electrode (such a layer is referred to as a liquid crystal layer).

Note that the following liquid crystals can be used for the liquid crystal element: a nematic liquid crystal, a cholesteric liquid crystal, a smectic liquid crystal, a discotic liquid crystal, a thermotropic liquid crystal, a lyotropic liquid crystal, a low molecular liquid crystal, a high molecular liquid crystal, a polymer dispersed liquid crystal (PDLC), a ferroelectric liquid crystal, an anti-ferroelectric liquid crystal, a main chain type liquid crystal, a side chain type polymer liquid crystal, a plasma addressed liquid crystal (PALC), and a banana-shaped liquid crystal. Moreover, the following driving methods of a liquid crystal can be used, for example: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and a blue phase mode.

The capacitor 323 functions as a storage capacitor, and has a first terminal and a second terminal. The first terminal is electrically connected to the other of the source and the drain of the transistor 321. The ground potential or a potential with a given value is supplied to the second terminal. The capacitor 323 includes a first electrode which serves as part or all of the first terminal, a second electrode which serves as part or all of the second terminal, and a dielectric layer. Note that the capacitor 323 is not necessarily provided.

One of a source and a drain of the transistor 331 is electrically connected to the signal line 305, and the other of the source and the drain of the transistor 331 is electrically connected to the scan line 304.

The photodetector element 332 has an anode and a cathode. The anode is electrically connected to a gate of the transistor 331. The cathode is electrically connected to a potential control line 306. As an example, a PIN diode is used as the photodetector element 332 in this embodiment. The PIN diode includes a layer or a region having p-type conductivity, which serves as the anode; a layer or a region having n-type conductivity, which serves as the cathode; and a high resistance region which is provided between the anode and the cathode, and has a higher resistance than the anode and the cathode.

Figure 3A:
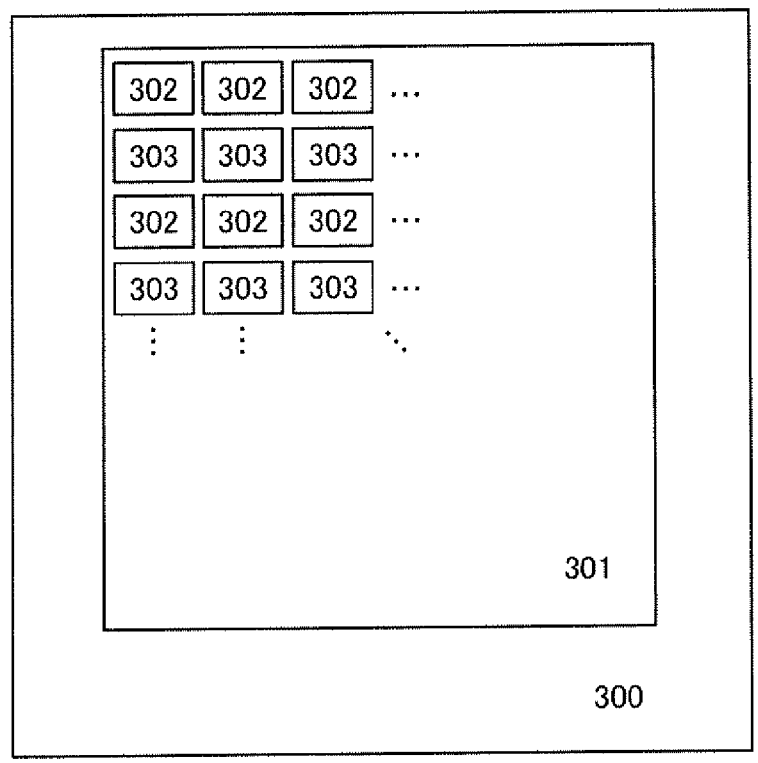
FIGS. 3A and 3B are block diagrams each illustrating an example of a structure of a pixel portion in an image input-output device in Embodiment 2.
Figure 3B:
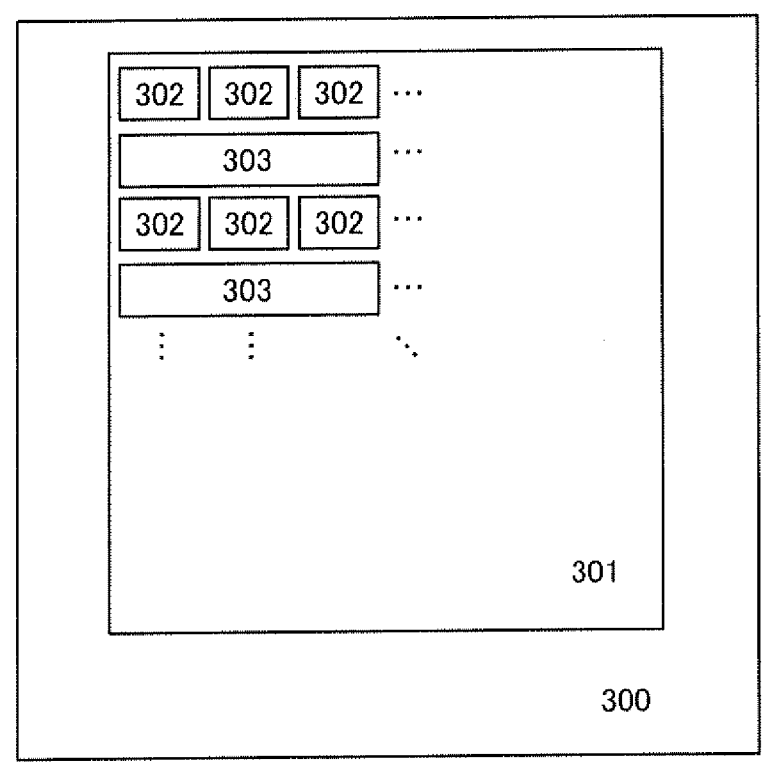

When a pixel portion is constituted by a plurality of pixels, the pixel portion of the image input-output device in this embodiment can have a structure illustrated in FIGS. 3A and 3B. FIGS. 3A and 3B are block diagrams each illustrating an example of a structure of a pixel portion in the image input-output device in this embodiment.

A pixel portion 301 of an image input-output device 300 illustrated in FIG. 3A has a structure where one photodetector circuit 303 is provided for one display circuit 302 (such a structure is also referred to as a first structure). For example, when full color display is performed with the first structure by using a plurality of colors such as RGB, one pixel is constituted by three display circuits and three photodetector circuits, and read operation for the respective colors can be performed by the photodetector circuits 303. Accordingly, the read operation can be performed with more accuracy.

Further, the pixel portion 301 of the image input-output device 300 illustrated in FIG. 313 has a structure where one photodetector circuit 303 is provided for a plurality of display circuits 302 (three display circuits 302 in FIG. 3B) (such a structure is also referred to as a second structure). For example, when full color display is performed with the second structure by using a plurality of colors such as RGB, one pixel is constituted by three display circuits and one photodetector circuit, and read operation for a plurality of colors can be performed by one photodetector circuit 303. Thus, the circuit area can be reduced.

Next, operation of the pixel illustrated in FIG. 2 will be described.

The operation of the pixel in FIG. 2 is classified into two periods of a display (output) period and a read (input) period. The operation in each period will be described below.

In the display period, the transistor 321 is turned on by a signal input from the scan line 304.

At this time, a potential corresponding to a data signal is supplied from the signal line 305 to the first terminal of the liquid crystal element 322, so that a potential of the first terminal of the liquid crystal element 322 becomes a potential of the data signal (also referred to as Vdata), and the transmittance of the liquid crystal element 322 is set in accordance with voltage applied between the first terminal and the second terminal. After data writing, the transistor 321 is turned off by a scan signal input from the scan line 304, the transmittance of the liquid crystal element 322 is maintained during the display period, and the pixel enters into a display state. The above operation is sequentially performed every scan line 304, so that the data writing and display are performed in all the pixels.

In the read period, the photodetector circuit 303 by which the illuminance of incident light is read as data is selected. In the selected photodetector circuit 303, a potential higher than a given potential is supplied from the potential control line 306 to the cathode of the photodetector element 332, and the gate of the transistor 331 is supplied with a potential obtained by adding a voltage applied between the anode and the cathode of the photodetector element 332 to a potential of the potential control line 306. At this time, a current corresponding to the illuminance of incident light is generated by the photodetector element 332, so that a voltage corresponding to the illuminance of light entering the photodetector element 332 is applied between the anode and the cathode of the photodetector element 332. Moreover, the signal line 305 is precharged to a fixed potential.

Further, when the transistor 331 is turned on, electric charge is discharged from the signal line 305. At this time, a potential of the scan line 304 is set lower than the given potential in advance so that a current flows from the signal line 305 to the scan line 304. The read operation can be performed by reading the potential of the signal line 305 as data.

Figure 4:
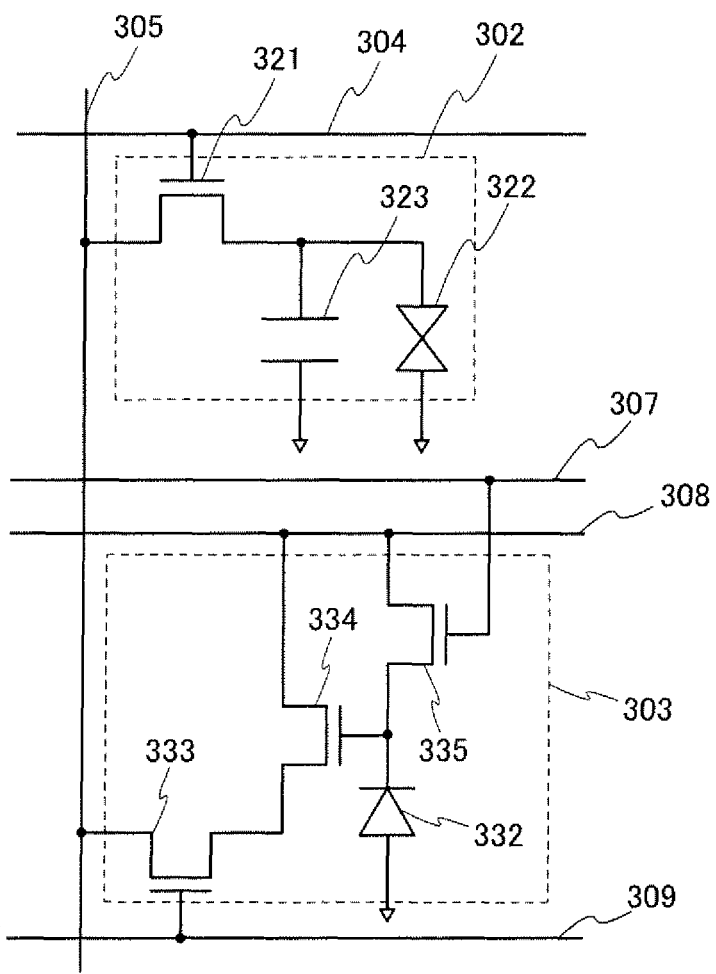
FIG. 4 is a circuit diagram illustrating an example of a structure of a pixel portion in an image input-output device in Embodiment 2.

Note that the pixel of the image input-output device in this embodiment is not limited to having the circuit configuration illustrated in FIG. 2, and can have the following structures, for example: a structure A where a selection line and a selection switch are added to the circuit configuration in FIG. 2, a structure B where a reset control line and a reset switch are added to the circuit configuration in FIG. 2, and a structure C obtained by combining the structure A and the structure B. Another structure of the pixel is described with reference to FIG. 4. FIG. 4 is a circuit diagram illustrating an example of a structure of the pixel in the image input-output device in this embodiment. In FIG. 4, the structure C is illustrated as an example.

Like the pixel illustrated in FIG. 2, the pixel illustrated in FIG. 4 is divided into the display circuit 302 and the photodetector circuit 303. The display circuit 302 has the same structure as the display circuit 302 in FIG. 2, and includes the transistor 321, the liquid crystal element 322, and the capacitor 323. Note that in the pixel in FIG. 4, the description of the pixel in FIG. 2 is employed as appropriate for the same portions as the pixel in FIG. 2.

The photodetector circuit 303 includes a transistor 333, a transistor 334, a transistor 335, and the photodetector element 332.

The transistor 333 functions as a selection switch. A gate of the transistor 333 is electrically connected to a scan line 309, and one of a source and a drain of the transistor 333 is electrically connected to the signal line 305.

The transistor 334 functions as an amplifier element. One of a source and a drain of the transistor 334 is electrically connected to a power supply line 308, and the other of the source and the drain of the transistor 334 is electrically connected to the other of the source and a drain of the transistor 333.

The transistor 335 functions as a reset switch. A gate of the transistor 335 is electrically connected to a reset control line 307, one of a source and a drain of the transistor 335 is electrically connected to the power supply line 308, and the other of the source and the drain of the transistor 335 is electrically connected to a gate of the transistor 334.

The ground potential or a constant potential with a given value is supplied to the anode of the photodetector element 332. The cathode of the photodetector element 332 is electrically connected to the other of the source and the drain of the transistor 335.

Note that as each of the transistors 333 to 335, a transistor with a structure which can be applied to the transistor 331 illustrated in FIG. 2 can be used, for example.

In the pixel illustrated in FIG. 4, the photodetector circuit 303 is constituted by a plurality of transistors. By forming the photodetector circuit 303 using a plurality of transistors, stable read operation can be performed.

Next, operation of the pixel illustrated in FIG. 4 will be described.

In the display period, the transistor 321 is turned on by a signal input from the scan line 304.

At this time, a potential corresponding to a data signal is supplied from the signal line 305 to the first terminal of the liquid crystal element 322, so that a potential of the first terminal of the liquid crystal element 322 becomes Vdata, and the transmittance of the liquid crystal element 322 is set in accordance with voltage applied between the first terminal and the second terminal. After data writing, the transistor 321 is turned off by a scan signal input from the scan line 304, the transmittance of the liquid crystal element 322 is maintained during the display period, and the pixel enters into a display state. The above operation is sequentially performed every scan line 304, so that the data writing and display are performed in all the pixels.

In the read period, first, the transistor 335 is turned on by a reset signal input from the reset control line 307. At this time, a potential at a node of the transistors 334 and 335 and the photodetector element 332 is equal to the potential of the power supply line 308, and the node enters into a reset state.

After the reset of the node, the transistor 335 is turned off. At this time, a current corresponding to the illuminance of incident light is generated by the photodetector element 332, and a potential of the gate of the transistor 334 is reduced by the generated current. Moreover, the transistor 333 is turned on by a signal input from the scan line 309. Accordingly, a potential of the cathode of the photodetector element 332 is supplied to the signal line 305 through the transistors 333 and 334. The read operation is performed using the potential of the signal line 305 as image data.

Figure 5:
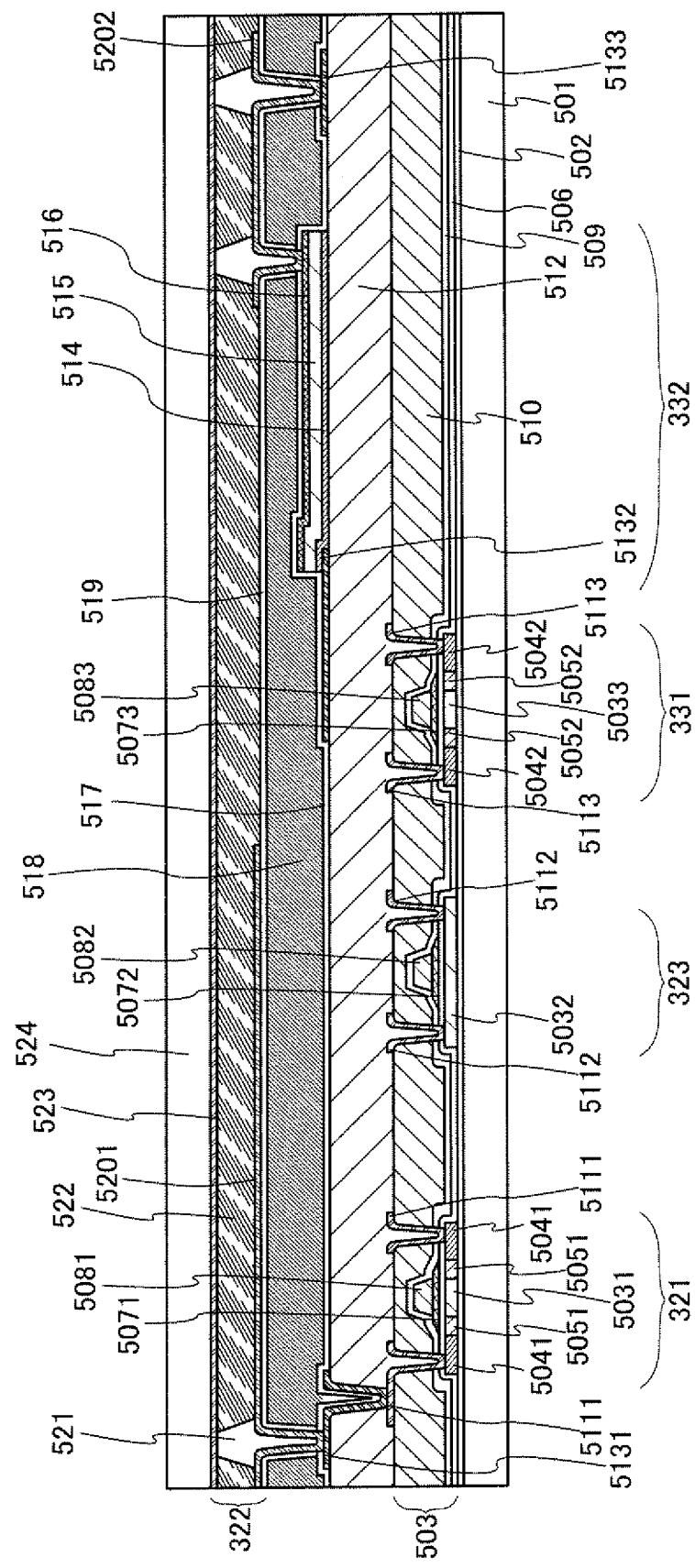
FIG. 5 is a cross-sectional view illustrating an example of a structure of a pixel portion in an image input-output device in Embodiment 2.

Next, a structure of the pixel in the image input-output device in this embodiment will be described with reference to FIG. 5. FIG. 5 is a cross-sectional view illustrating an example of a structure of the pixel in the image input-output device in this embodiment.

A pixel illustrated in FIG. 5 includes a substrate 501, a base film 502, an element formation layer 503, an interlayer film 512, an electrode 5131, the photodetector element 332, a protective film 517, a color layer 518, a protective film 519, the liquid crystal element 322, an electrode 5202, and a substrate 524.

In the pixel in FIG. 5, the base film 502 is provided over the substrate 501. The element formation layer 503 is provided over the base film 502. The interlayer film 512 is provided over the element formation layer 503. The electrode 5131, the photodetector element 332, and an electrode 5133 are provided over the interlayer film 512. The protective film 517 is provided over the electrode 5131 and the photodetector element 332. The color layer 518 is provided over the protective film 517. The protective film 519 is provided over the color layer 518.

As the substrate 501, any of the substrates which can be used as the substrate 101 illustrated in FIG. 1 in Embodiment 1 can be used.

As the base film 502, a silicon oxide film, a silicon nitride film, or a silicon oxide film containing nitrogen can be used, for example. Alternatively, the base film 502 can be provided by stacking the above silicon films. Note that although the base film 502 is not necessarily provided, the provision of the base film 502 can prevent impurities such as alkali metal from the substrate 501 from diffusing into the layers formed over the base film 502, for example. Further, when the base film 502 is provided, a silicon substrate, a metal substrate, a stainless steel substrate, or the like can also be used as the substrate 501.

The element formation layer 503 includes at least the transistor 321, the capacitor 323, and the transistor 331. The structure of the element formation layer 503 will be described below.

The element formation layer 503 includes semiconductor layers 5031, 5032, and 5033; an insulating film 506; conductive layers 5071, 5072, and 5073; conductive layers 5081, 5082, and 5083; interlayer films 509 and 510; a pair of electrodes 5111; a pair of electrodes 5112; and a pair of electrodes 5113.

The semiconductor layers 5031 to 5033 are provided over the base film 502. The insulating film 506 is provided over the semiconductor layers 5031 to 5033. The conductive layer 5071 is provided over part of the insulating film 506 formed over the semiconductor layer 5031. The conductive layer 5072 is provided over part of the insulating film 506 formed over the semiconductor layer 5032. The conductive layer 5073 is provided over part of the insulating film 506 formed over the semiconductor layer 5033. The conductive layer 5081 is provided over part of the conductive layer 5071. The conductive layer 5082 is provided over part of the conductive layer 5072. The conductive layer 5083 is provided over part of the conductive layer 5073. The interlayer film 509 is provided over the insulating film 506, the conductive layers 5071 to 5073, and the conductive layers 5081 to 5083. The interlayer film 510 is provided over the interlayer film 509. The electrodes 5111 to 5113 are provided over the interlayer film 510.

The transistor 321 includes the semiconductor layer 5031, the insulating film 506, the conductive layer 5071, and the conductive layer 5081. The semiconductor layer 5031 includes a pair of impurity regions 5041, a pair of impurity regions 5051 which is provided between the pair of impurity regions 5041 and has lower impurity concentration than the impurity regions 5041, and a channel region between the pair of impurity regions 5051. In the transistor 321, the insulating film 506 functions as a gate insulating film. The conductive layers 5071 and 5081 function as a gate electrode. The pair of impurity regions 5041 functions as a source region and a drain region. The pair of impurity regions 5051 functions as low concentration impurity regions (also referred to as lightly doped drain (LDD) regions). The electrodes 5111 are electrically connected to the impurity region 5041 through opening portions provided in the insulating film 506 and the interlayer films 509 and 510. At this time, the pair of electrodes 5111 functions as a source electrode and a drain electrode.

The capacitor 323 includes the semiconductor layer 5032, the insulating film 506, the conductive layer 5072, and the conductive layer 5082. The electrodes 5112 are electrically connected to the semiconductor layer 5032 through opening portions provided in the insulating film 506 and the interlayer films 509 and 510.

The transistor 331 includes the semiconductor layer 5033, the insulating film 506, the conductive layer 5073, and the conductive layer 5083. The semiconductor layer 5033 includes a pair of impurity regions 5042, a pair of impurity regions 5052 which is provided between the pair of impurity regions 5042 and has lower impurity concentration than the impurity regions 5042, and a channel region between the pair of impurity regions 5052. In the transistor 331, the insulating film 506 functions as a gate insulating film. The conductive layers 5073 and 5083 function as a gate electrode. The pair of impurity regions 5042 functions as a source region and a drain region. The pair of impurity regions 5052 functions as low concentration impurity regions. The electrodes 5113 are electrically connected to the impurity region 5042 through opening portions provided in the insulating film 506 and the interlayer films 509 and 510. At this time, the pair of electrodes 5113 functions as a source electrode and a drain electrode.

For the semiconductor layers 5031 to 5033, an amorphous semiconductor, a microcrystalline (microcrystal) semiconductor, or a polycrystalline semiconductor can be used, for example. Moreover, an oxide semiconductor can be used. As the oxide semiconductor, zinc oxide or an oxide semiconductor represented by $InMO_3(ZnO)_m$ (m>0) can be used, for example. Note that M represents one or more of metal elements selected from gallium (Ga), iron (Fe), nickel (Ni), manganese (Mn), or cobalt (Co). As an example, M may be Ga or may include the above metal element in addition to Ga, for example, M may be Ga and Ni or Ga and Fe. Moreover, the oxide semiconductor may contain a transition metal element such as Fe or Ni or oxide of the transition metal element as an impurity element in addition to the metal element contained as M. Alternatively, a single crystal semiconductor can be used. For example, single crystal silicon can be used in the case of employing a structure where the substrate 501 and the semiconductor layers 5031 to 5033 are attached to each other with a bonding layer therebetween. At this time, the bonding layer has a smooth and hydrophilic bonding surface and can be formed using silicon oxide containing hydrogen, silicon nitride containing hydrogen, silicon nitride containing oxygen and hydrogen, silicon oxynitride, silicon nitride oxide, or the like.

As silicon oxide containing hydrogen, silicon oxide formed by a chemical vapor deposition method using organosilane is preferably used, for example. This is because the substrate 501 and the semiconductor layers 5031 to 5033 can be firmly bonded to each other with a silicon oxide film formed using organosilane, for example. As organosilane, a silicon-containing compound such as tetraethoxysilane (TEOS, $Si(OC_2H_5)_4$), tetramethylsilane (TMS, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or tris(dimethylamino)silane ($SiH(N(CH_3)_2)_3$) can be used, for example.

Note that when the bonding layer is formed using silicon oxide, the bonding layer can be formed by a CVD method using monosilane, disilane, or trisilane as a source gas. Further, the silicon oxide layer serving as the bonding layer may be a thermal oxide film and preferably contains chlorine.

Silicon nitride containing hydrogen can be formed by a plasma CVD method using a silane gas and an ammonia gas. Further, hydrogen may be added to the gases. Silicon nitride containing oxygen and hydrogen can be formed by a plasma CVD method using a silane gas, an ammonia gas, and a nitrous oxide gas. In either case, silicon oxide, silicon oxynitride, or silicon nitride oxide, which contains hydrogen and is formed using a silane gas or the like as a source gas by a CVD method such as a plasma CVD method, a reduced pressure CVD method, or an atmosphere pressure CVD method, can be used for the bonding layer.

As the insulating film 506, a silicon nitride film, a silicon oxide film, or a silicon oxide film containing nitrogen can be used, for example.

For the first conductive layers 5071, 5072, and 5073, an element selected from titanium, tungsten, tantalum, molybdenum, neodymium, cobalt, zirconium, zinc, ruthenium, rhodium, palladium, osmium, iridium, platinum, aluminum, gold, silver, or copper; an alloy material or a compound material containing the above element as its main component; or nitride of the above element can be used, for example.

For the second conductive layers 5081, 5082, and 5083, an element selected from titanium, tungsten, tantalum, molybdenum, neodymium, cobalt, zirconium, zinc, ruthenium, rhodium, palladium, osmium, iridium, platinum, aluminum, gold, silver, or copper; an alloy material or a compound material containing the above element as its main component; or nitride of the above element can be used, for example.

Note that in this embodiment, the transistors 321 and 331 are described as staggered transistors; however, this embodiment is not limited thereto, and an inverted staggered transistor or a coplanar transistor can be used. Moreover, a transistor with another structure, such as a dual-gate transistor or a double-gate transistor, can also be used.

As the interlayer films 509 and 510, a silicon oxide film, a silicon nitride film, or a silicon oxide film containing nitrogen can be used, for example. Further, the interlayer film 509 can also function as a protective film.

For the electrodes 5111 to 5113, an element selected from titanium, tungsten, tantalum, molybdenum, neodymium, cobalt, zirconium, zinc, ruthenium, rhodium, palladium, osmium, iridium, platinum, aluminum, gold, silver, or copper; an alloy material or a compound material containing the above element as its main component; or nitride of the above element can be used, for example. Alternatively, the electrodes 5111 to 5113 can have a layered structure using a plurality of materials.

The interlayer film 512 can be formed using any of the materials which can be used for the interlayer films 509 and 510, for example.

In the pixel illustrated in FIG. 5, a PIN photodiode is used as the photodetector element 332. The structure of the photodetector element 332 will be described below.

The photodetector element 332 in FIG. 5 includes an electrode 5132, the electrode 5133, semiconductor layers 514, 515, and 516, and the electrode 5202. Note that FIG. 5 illustrates that the photodetector element 332 overlaps with only the transistor 331 in the plan view; however, this embodiment is not limited thereto, and the photodetector element 332 can be placed so as to overlap with the transistor 321 and the capacitor 323.

The electrodes 5132 and 5133 are provided over the interlayer film 512. The semiconductor layer 514 is provided so as to be in contact with the electrode 5132. The semiconductor layer 515 is provided over the semiconductor layer 514. The semiconductor layer 516 is provided over the semiconductor layer 515. The electrode 5202 is provided over the protective film 519.

The semiconductor layer 514 has one of p-type conductivity and n-type conductivity. The semiconductor layer 515 has a higher resistance than the semiconductor layer 514. The provision of the semiconductor layer 515 can increase the thickness of a depletion layer, so that adverse effects of parasitic capacitance can be reduced. The semiconductor layer 516 has a lower resistance than the semiconductor layer 515. For example, an intrinsic semiconductor can be used for the semiconductor layer 515; however, the semiconductor layer 515 is not necessarily limited to an intrinsic semiconductor, and can have a structure where an impurity element is added. The semiconductor layers 514, 515, and 516 can be formed using amorphous silicon, microcrystalline silicon, polycrystalline silicon, or single crystal silicon, for example. In the photodetector element 332, the electrode 5132 functions as part of the first terminal, and the semiconductor layers 514 to 516 function as a photoelectric conversion layer, Further, the semiconductor layer 516, the electrode 5202, and the electrode 5133 are electrically connected to each other through opening portions provided in the protective film 517, the color layer 518, and the protective film 519. At this time, the electrodes 5202 and 5133 function as part of the second terminal.

The electrode 5131 is electrically connected to one of the pair of electrodes 5111 through an opening portion provided in the interlayer film 512. At this time, the electrode 5131 functions as a wiring.

The color layer 518 is a layer in which a dye, a pigment, or the like is used as a color material. Full color can be expressed using three kinds of color layers of R, G, and B, for example. In this embodiment, the color layer 518 is preferably provided so as to overlap with part or all of the photodetector element 332 in the plan view. When the color layer 518 is provided so as to overlap with the photodetector element 332, light is likely to enter the photodetector element 332 through the color layer 518. Further, in the plan view, the photodetector element 332 and the color layer 518 are not necessarily provided so as to overlap with each other. The photodetector element 332 and the color layer 518 can be placed in a different way, for example, they are placed so as not to overlap with each other in the plan view, as long as light enters the photodetector element 332 through the color layer 518.

Although the protective films 517 and 519 are not necessarily provided, the provision of the protective films 517 and 519 can prevent the pigment, the dye, or the like from diffusing from the color layer 518. As the protective films 517 and 519, silicon nitride films can be used, for example.

In the pixel in FIG. 5, a liquid crystal element of a vertical electric field mode, which includes a liquid crystal layer between a pair of electrodes, is used as the liquid crystal element 322. The structure of the liquid crystal element 322 will be described below. Note that the operation mode of the image input-output device in this embodiment is not limited to a vertical electric field mode, and a transverse electric field mode can be used, for example.

The liquid crystal element 322 illustrated in FIG. 5 includes an electrode 5201, partition layers 521, a liquid crystal layer 522, and an electrode 523.

The electrode 5201 is provided over the protective film 519. The partition layers 521 are selectively provided over at least the electrode 5201. The liquid crystal layer 522 is provided over at least the electrode 5201. The electrode 523 is provided over the partition layers 521 and the liquid crystal layer 522. The substrate 524 is provided over the electrode 523.

Further, the electrode 5201 is electrically connected to the electrode 5131 through an opening portion provided in the protective film 517, the color layer 518, and the protective film 519. At this time, the electrode 5201 functions as a pixel electrode and the electrode 523 functions as a counter electrode.

For the electrodes 5201, 5202, and 523, any of the materials which can be used for the electrodes 5111 to 5113 can be used.

Note that the liquid crystal element 322 can be provided with an alignment film.

Note that in FIG. 5, the electrode 5201 overlaps with part or all of the transistor 321 and the capacitor 323 in the plan view; however, this embodiment is not limited thereto. and for example, the electrode 5201 can be provided so as to overlap with the transistor 321, the capacitor 323, the transistor 331, and the photodetector element 332. Alternatively, the electrode 5201 can be placed so as not to overlap with any of the transistor 321, the capacitor 323, the transistor 331, and the photodetector element 332. Further, when the electrode 5201 is provided over the photodetector element 332, the use of a normally white liquid crystal element can increase the transmittance of the liquid crystal layer 522 even in the read period; thus, light efficiently enters the photodetector element 332.

As illustrated in FIG. 5, the image input-output device in this embodiment has a structure where a transistor, a photodetector element, and a color layer are provided over one substrate. The above structure is referred to as a color filter on array (COA) structure in this specification. With the COA structure, the distance between the photodetector element and the color layer can be made shorter than the in the case in which a substrate where a color layer is formed is different from a substrate where a photodetector element and a display element are formed. Accordingly, light can be prevented from entering, for example, a photodetector element on which light passing through a color layer of a predetermined color is to enter, through a color filter of a color other than the predetermined color, and the reading accuracy can be improved. Moreover, the COA structure can improve the alignment accuracy as compared to the case where a color layer and an element such as a transistor are provided over different substrates; thus, the aperture ratio can be increased.

Further, in the image input-output device in this embodiment, the color layer functions as a planarization film. Accordingly, it is not necessary to provide an additional planarization film, and the process can be simplified.

Furthermore, the image input-output device in this embodiment has a multilayer wiring structure. Although it is not necessary to employ a multilayer wiring structure, the multilayer wiring structure can reduce the circuit area.

Figure 6:
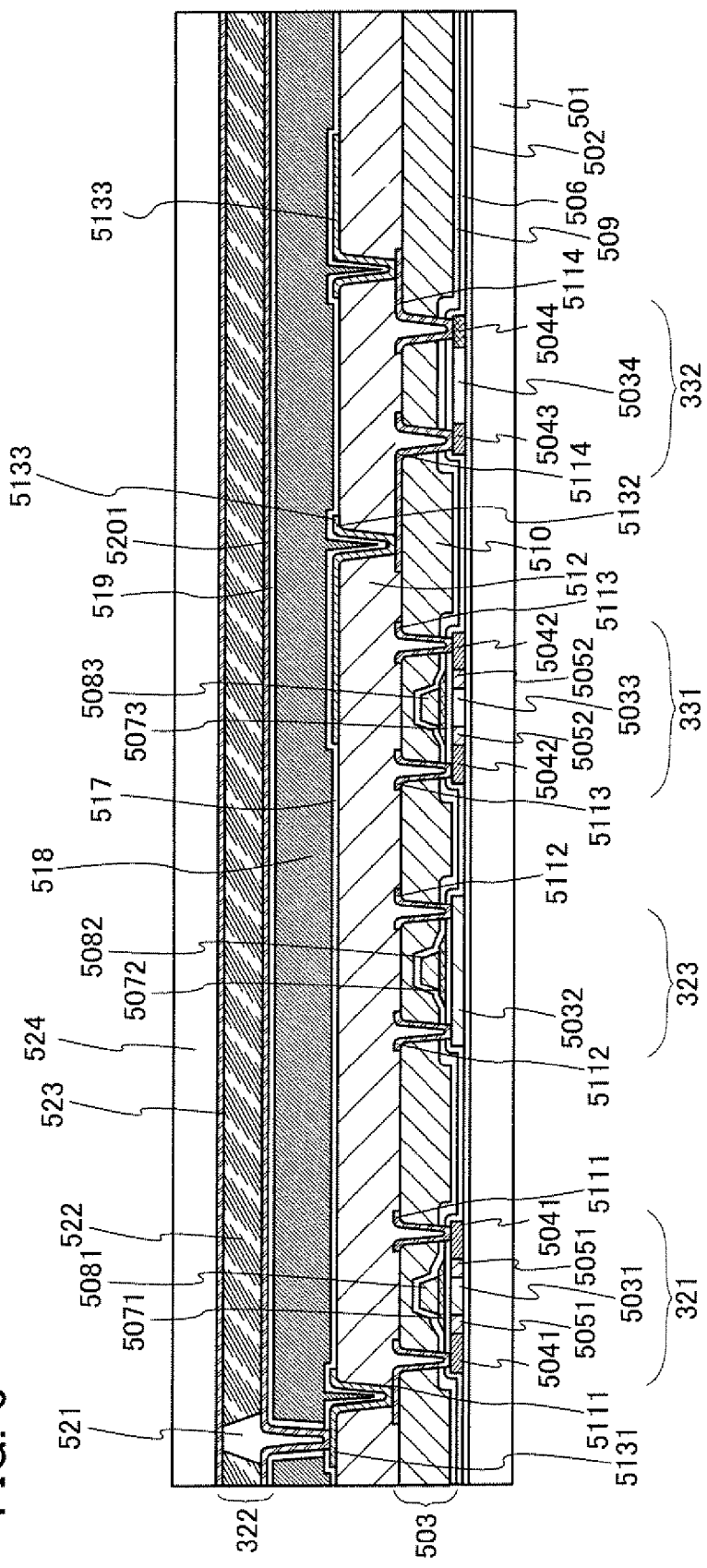
FIG. 6 is a cross-sectional view illustrating an example of a structure of a pixel in an image input-output device in Embodiment 2.

In addition, a photodetector element with another structure can be used in the image input-output device in this embodiment. A structure of a pixel in an image input-output device including a photodetector element with another structure is described with reference to FIG. 6. FIG. 6 is a cross-sectional view illustrating an example of a structure of a pixel in the image input-output device in this embodiment. Note that in the structure of the image input-output device illustrated in FIG. 6, the description of the pixel in the image input-output device in FIG. 5 is employed as appropriate for the same portions as the image input-output device in FIG. 5.

The pixel structure illustrated in FIG. 6 is as follows. The pixel includes the photodetector element 332 including a semiconductor layer 5034 and a pair of electrodes 5114. The semiconductor layer 5034 includes an impurity region 5043 having one of p-type conductivity and n-type conductivity, and an impurity region 5044 having the other of p-type conductivity and n-type conductivity. One of the pair of electrodes 5114 is electrically connected to the impurity region 5043 through an opening portion provided in the insulating film 506 and the interlayer films 509 and 510. The other of the pair of electrodes 5114 is electrically connected to the impurity region 5044 through an opening portion provided in the insulating film 506 and the interlayer films 509 and 510.

As described above, the photodetector element 332 illustrated in FIG. 6 is a lateral-junction PIN diode in which one semiconductor layer includes a region of p-type conductivity and a region of n-type conductivity. By using the lateral-junction PIN diode, the thickness of the image input-output device can be reduced. Moreover, the PIN diode can be formed together with the transistors 321 and 331, so that the number of steps can be reduced.

Figure 7:
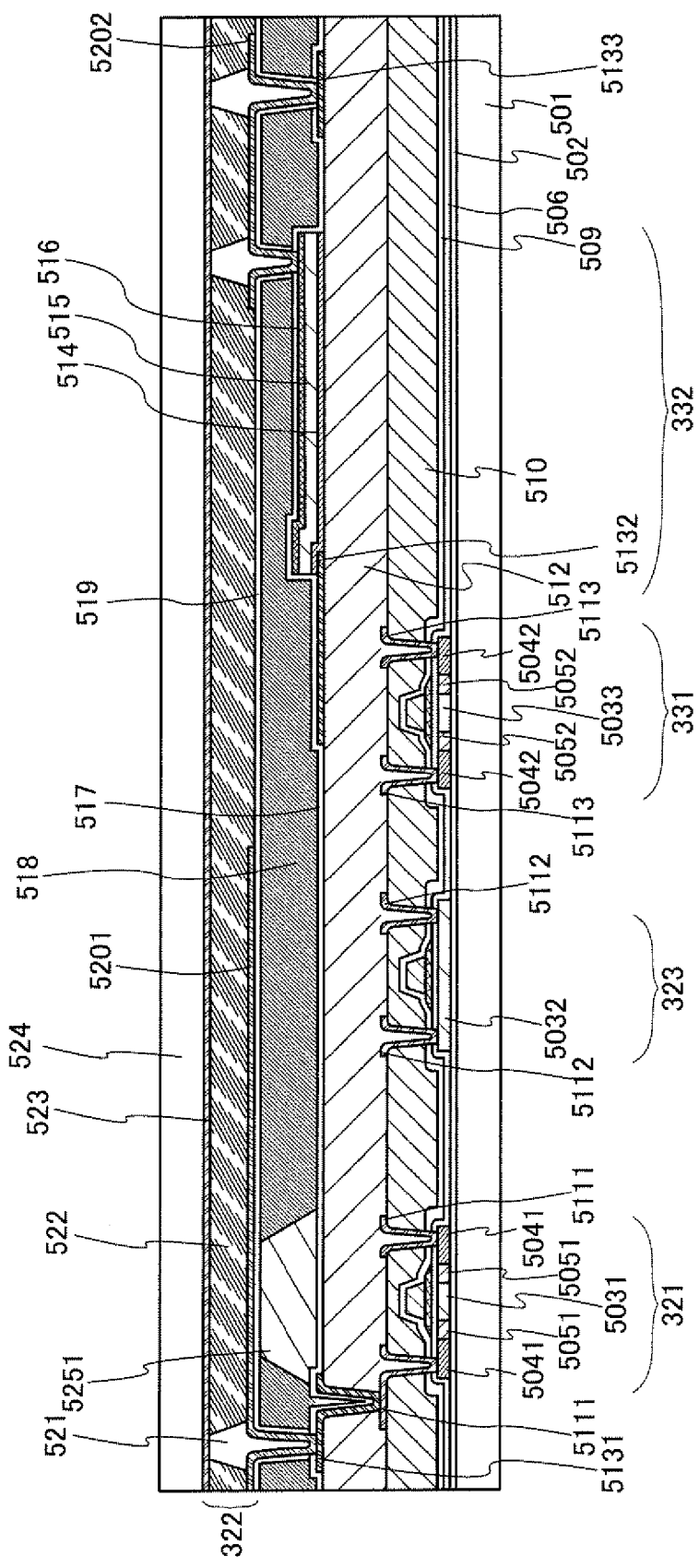
FIG. 7 is a cross-sectional view illustrating an example of a structure of an image input-output device in Embodiment 2 in the case where a light blocking layer is provided in the image input-output device.

In addition, the image input-output device in this embodiment can include a light blocking layer (also referred to as a black matrix). A structure of the image input-output device including a light blocking layer will be described with reference to FIG. 7. FIG. 7 is a cross-sectional view illustrating an example of a structure of the image input-output device in the case where a light blocking layer is provided. Note that in the structure of the image input-output device illustrated in FIG. 7, the description of the pixel in the image input-output device in FIG. 5 is employed as appropriate for the same portions as the image input-output device in FIG. 5.

The image input-output device illustrated in FIG. 7 includes a light blocking layer 5251 which is selectively provided over the protective film 517, in addition to the structure of the image input-output device in FIG. 5.

In the image input-output device in FIG. 7, the light blocking layer 5251 is provided on the substrate 501 side. By providing the light blocking layer 5251 on the substrate 501 side, the alignment accuracy can be improved. Note that the light blocking layer 5251 is not necessarily provided on the substrate 501 side, and can be provided on the substrate 524 side.

As illustrated in FIG. 7, with the structure where the light blocking layer 5251 is provided, for example, light can be prevented from entering the transistor; thus, deterioration of the transistor can be prevented.

The image input-output device in this embodiment can have a variety of functions by utilizing the above-described display function and read function. As an example, a function of inputting and outputting text, a function of detecting position, and a function of inputting and outputting documents are described with reference to FIGS. 8A and 8B and FIG. 9, FIGS. 8A and 8B and FIG. 9 each illustrate an example of a function of the image input-output device in this embodiment.

Figure 8A:
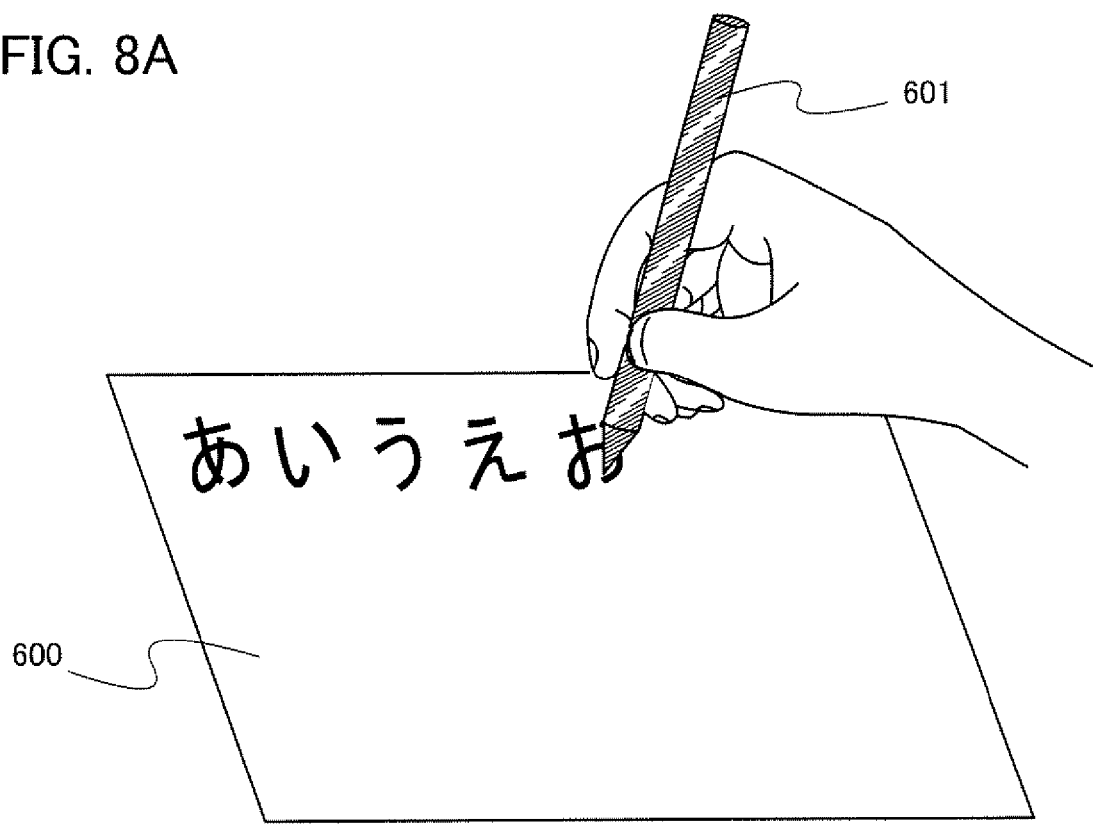
FIGS. 8A and 8B each illustrate a function of an image input-output device in Embodiment 2.

FIG. 8A illustrates a function of inputting and outputting text. As illustrated in FIG. 8A, an input means 601 is moved over a pixel portion 600 so that letters are written, for example. Accordingly, read operation is performed in the pixel portion 600, so that the trace of the input means 601 is read as data, and in the next display operation, the trace of the input means 601 is displayed on the pixel portion 600. Through the above operation, the operation of inputting and outputting text can be performed. Note that since the image input-output device, which is one embodiment of the invention disclosed in this specification, performs the read operation using the illuminance of light entering the photodetector circuit, the input means 601 is not necessarily in contact with the pixel portion 600. When text is input with the input means 601 in contact with the pixel portion 600, letters can be input to the pixel portion 600 as if letters are actually written on paper, for example; accordingly, letters can be input without discomfort. Further, by using the input means 601 including a light source, the operation of inputting and outputting text can be performed by detecting the illuminance of incident light from the light source in the input means.

Figure 8B:
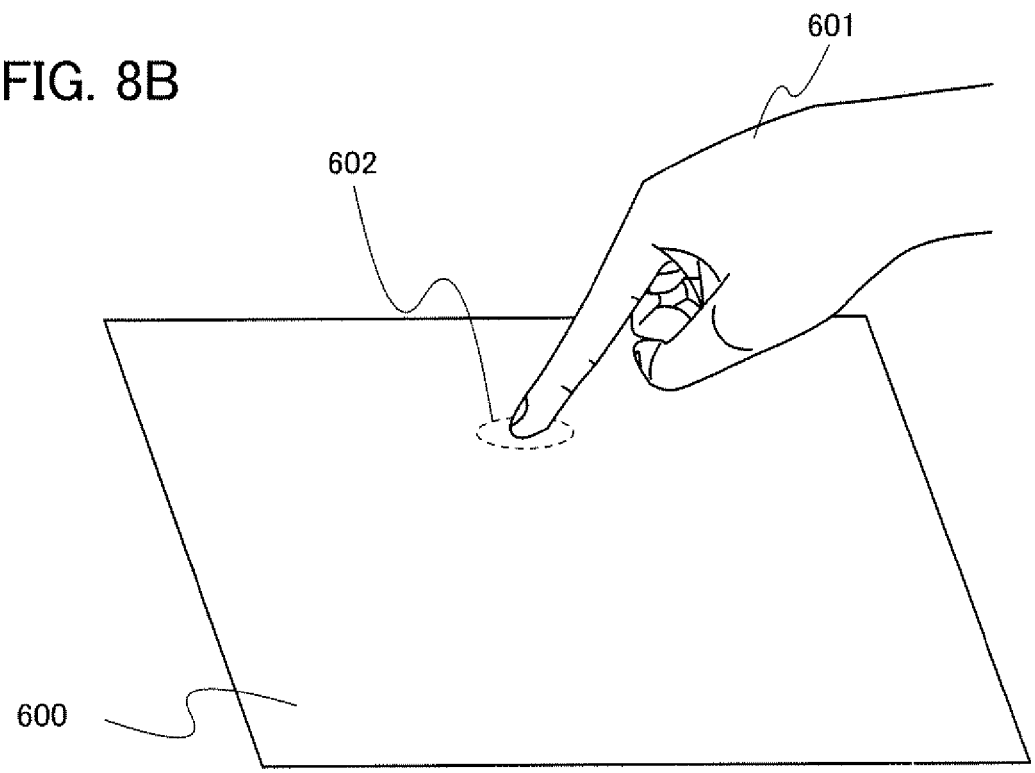

FIG. 8B illustrates a function of detecting position. As illustrated in FIG. 8B, when the input means 601 is placed at a given position 602 on the pixel portion 600, the read operation is performed, so that information on where the positions 602 is located can be obtained. Through the above operation, the operation of detecting position can be performed. For example, the case is considered in which the image input-output device is designed so that a predetermined program is executed when there is an input to a predetermined position. in this case, when it is determined that there is an input to the given position 602, a program corresponding to the position 602 can be executed by using the position detection function. Note that FIG. 8B illustrates a finger as the input means 601, and a fingerprint can be read by using the finger. For example, when fingerprint data is stored in a memory circuit and the read fingerprint is compared with the fingerprint data, fingerprint identification can be performed. Moreover, the input means 601 is not limited to the finger of the hand, and a pen or the like can be used as the input means 601, for example.

Figure 9:
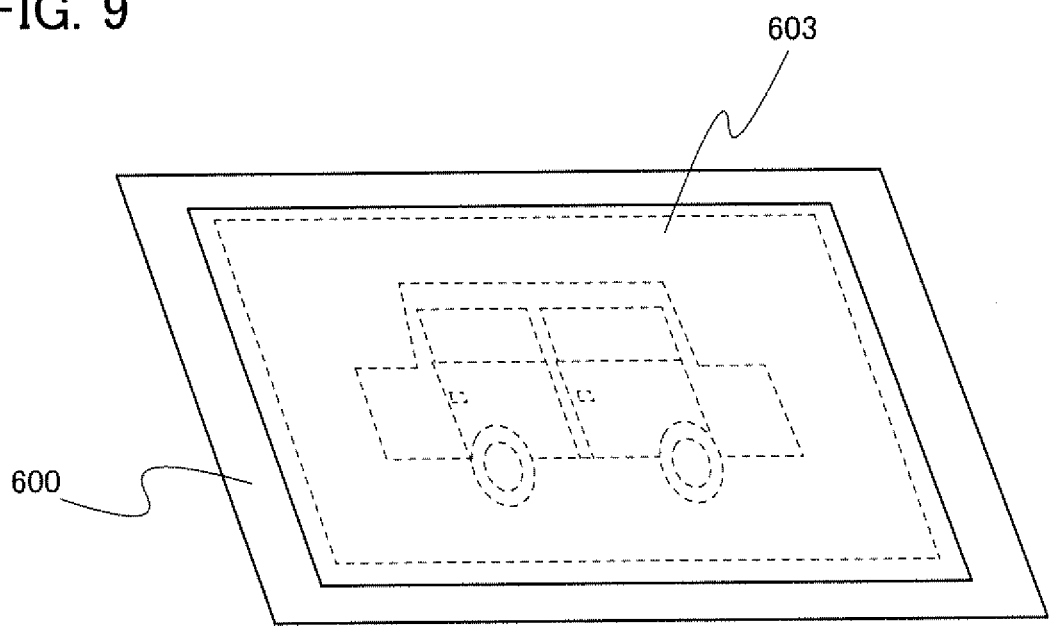
FIG. 9 illustrates a function of an image input-output device in Embodiment 2.

FIG. 9 illustrates a function of inputting and outputting documents. As illustrated in FIG. 9, when a document 603 is placed on the pixel portion 600 so that a surface to be read faces the pixel portion 600, the read operation is performed in each photodetector circuit. Accordingly, the document 603 can be read as data, and in the next display operation, the read document can be displayed on the pixel portion 600. Note that since the image input-output device, which is one embodiment of the invention disclosed in this specification, performs the read operation using the illuminance of incident light, the document 603 does not necessarily touch the pixel portion 600 in FIG. 9. Further, in the image input-output device, which is one embodiment of the invention disclosed in this specification, when a color layer is provided in the photodetector circuit, a document can be read in full color and displayed in full color.

Note that the image input-output device in this embodiment can have another function without limitation to the above functions, as long as the function can be realized using the display operation or the read operation.

Note that this embodiment can be implemented in combination with other embodiments as appropriate.

(Embodiment 3)

In this embodiment, a method for manufacturing an image input-output device, which is one embodiment of the invention disclosed in this specification, will be described.

A method for manufacturing an image input-output device in this embodiment will be described with reference to FIGS. 10A to 10C, FIGS. 11A to 11C, FIGS. 12A and 12B, FIGS. 13A and 138, FIGS. 14A and 14B, FIGS. 15A and 15B, and FIG. 16. FIGS. 10A to 10C, FIGS. 11A to 11C, FIGS. 12A and 12B, FIGS. 13A and 13B, FIGS. 14A and 14B, FIGS. 15A and 158, and FIG. 16 are cross-sectional views illustrating a method for manufacturing a pixel of the image input-output device in this embodiment. Note that in this embodiment, a method for manufacturing the image input-output device illustrated in FIG. 5 is described as an example.

Figure 10A:
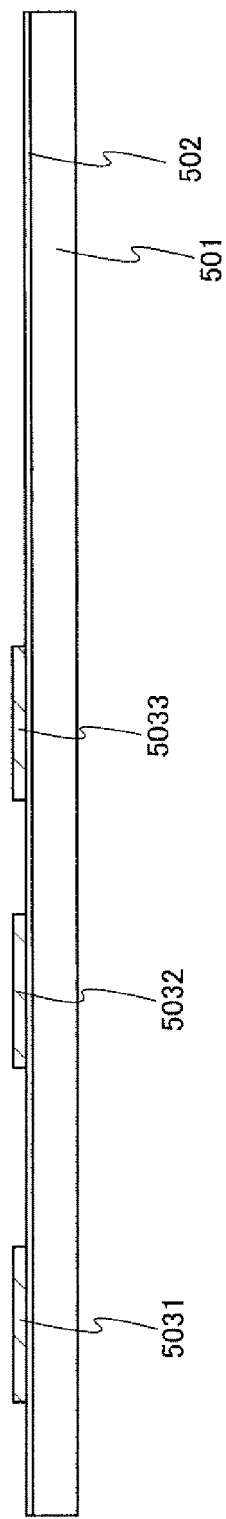
FIGS. 10A to 10C are cross-sectional views illustrating an example of a method for manufacturing a pixel in an image input-output device in Embodiment 3.

First, as illustrated in FIG. 10A, the base film 502 is formed over the substrate 501, and the semiconductor layers 5031, 5032, and 5033 are formed as island-shaped semiconductor layers over the base film 502. The base film 502 can be formed by a plasma CVD method, for example. The semiconductor layers 5031 to 5033 can be formed by a photolithography method, for example.

Figure 10B:
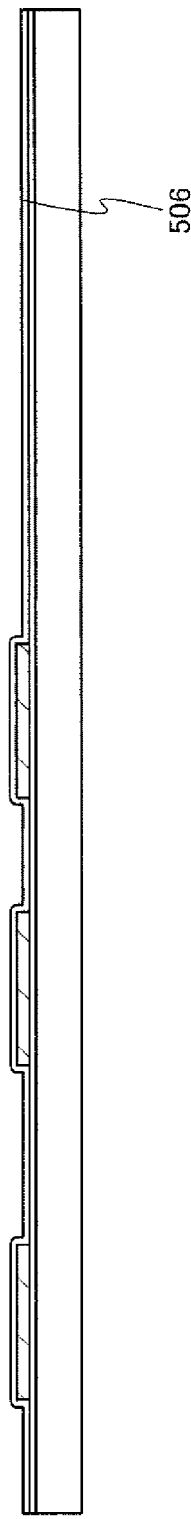

Then, as illustrated in FIG. 10B, the insulating film 506 is formed over the semiconductor layers 5031 to 5033. The insulating film 506 can be formed by a plasma CVD method, for example.

Figure 10C:
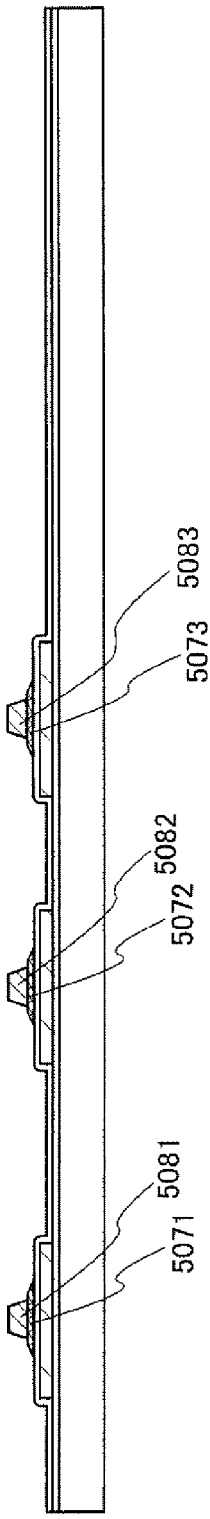

Next, as illustrated in FIG. 10C, a gate electrode or an electrode of a capacitor is formed over the insulating film 506 provided over the semiconductor layer. Specifically, the first conductive layer 5071 is formed over the insulating film 506 provided over the semiconductor layer 5031, and the second conductive layer 5081 is formed over part of the first conductive layer 5071. The first conductive layer 5072 is formed over the insulating film 506 provided over the semiconductor layer 5032, and the second conductive layer 5082 is formed over part of the first conductive layer 5072. The first conductive layer 5073 is formed over the insulating film 506 provided over the semiconductor layer 5033, and the second conductive layer 5083 is formed over part of the first conductive layer 5073. The first and second conductive layers 5071 and 5081, the first and second conductive layers 5072 and 5082, and the first and second conductive layers 5073 and 5083 can be formed by a sputtering method, for example.

Figure 11A:
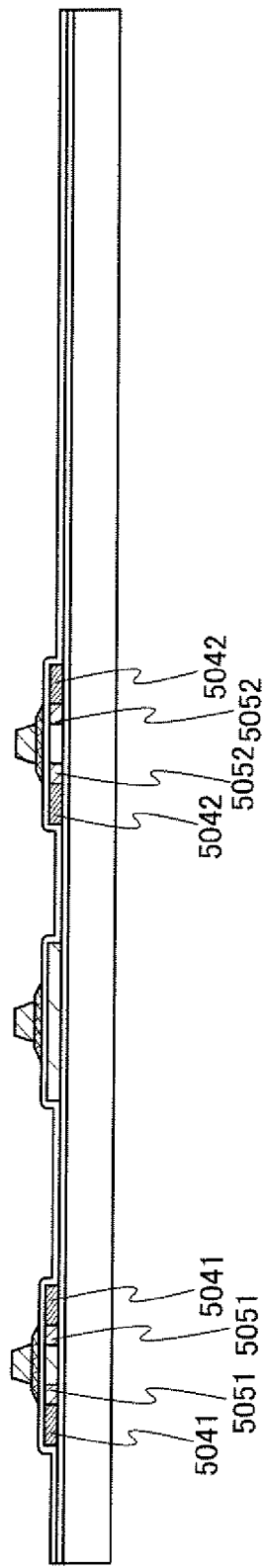
FIGS. 11A to 11C are cross-sectional views illustrating an example of a method for manufacturing a pixel in an image input-output device in Embodiment 3.

Then, as illustrated in FIG. 11A, by addition of an impurity element, the pair of first impurity regions 5041 and the pair of second impurity regions 5051 are formed in the semiconductor layer 5031, and the pair of first impurity regions 5042 and the pair of second impurity regions 5052 are formed in the semiconductor layer 5033. As the impurity element, phosphorus can be used for imparting n-type conductivity and boron for imparting p-type conductivity, for example.

Figure 11B:
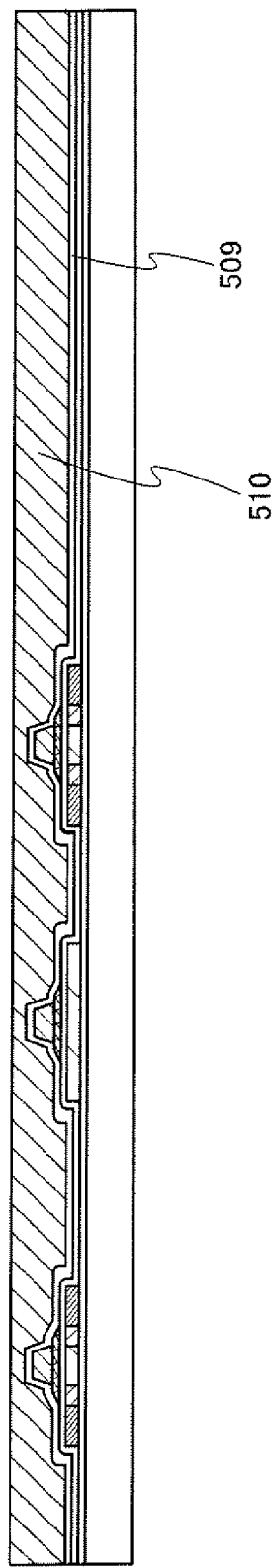

Next, as illustrated in FIG. 11B, the interlayer film 509 is formed over the first and second conductive layers 5071 and 5081, the first and second conductive layers 5072 and 5082, the first and second conductive layers 5073 and 5083, and the insulating film 506. The interlayer film 510 is formed over the interlayer film 509.

Figure 11C:
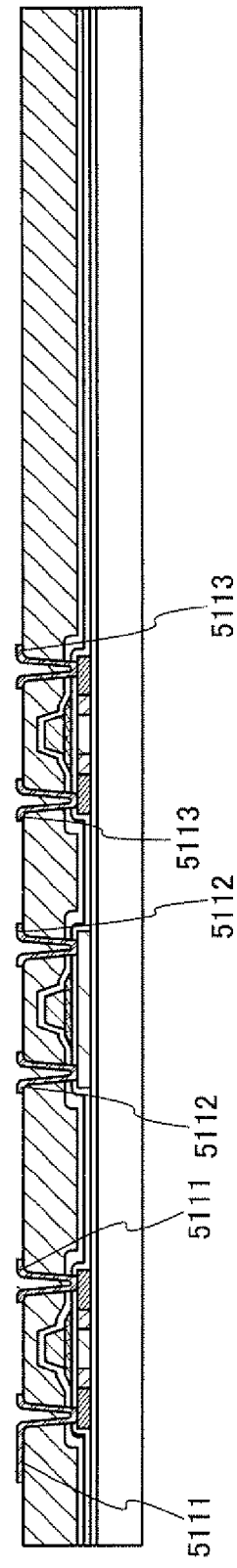

Next, opening portions are provided in the interlayer films 509 and 510. Then, as illustrated in FIG. 11C, the electrodes 5111 are formed so as to be in contact with the first impurity region 5041 through the opening portions; the electrodes 5112 are formed so as to be in contact with the semiconductor layer 5032 through the opening portions; and the electrodes 5113 are formed so as to be in contact with the first impurity region 5042 through the opening portions.

Figure 12A:
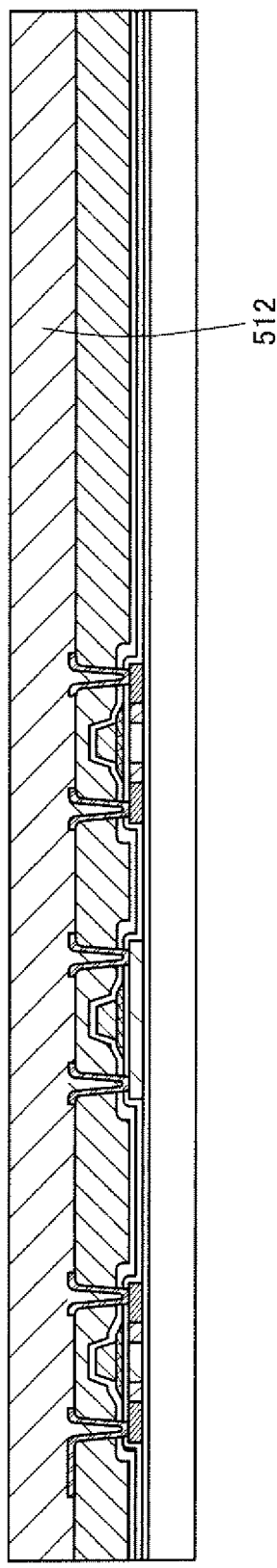
FIGS. 12A and 12B are cross-sectional views illustrating an example of a method for manufacturing a pixel in an image input-output device in Embodiment 3.

Then, as illustrated in FIG. 12A, the interlayer film 512 is formed over the electrodes 5111 to 5113 and the interlayer film 510.

Figure 12B:
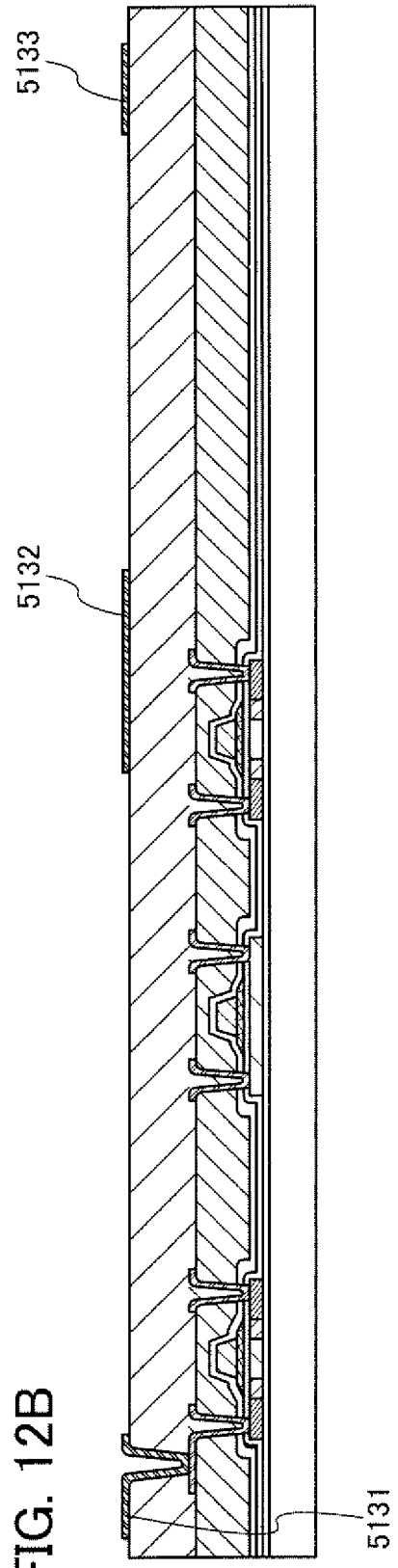

Next, as illustrated in FIG. 12B, an opening portion is provided in the interlayer film 512, and the electrode 5131 is formed so as to be electrically connected to one of the pair of electrodes 5111 through the opening portion. Further, the electrodes 5132 and 5133 are formed over the interlayer film 512.

Then, as illustrated in FIG. 13A, the semiconductor layer 514 is formed so as to be in contact with the electrode 5132, the semiconductor layer 515 is formed over the semiconductor layer 514, and the semiconductor layer 516 is formed over the semiconductor layer 515.

Next, as illustrated in FIG. 13B, the protective film 517 is formed over the interlayer film 512, the electrodes 5131 to 5133, and the semiconductor layers 514 to 516.

Then, as illustrated in FIG. 14A, the color layer 518 is formed over the protective film 517. The color layer 518 can be formed by a photolithography method, a printing method, or an inkjet method in the case of using a dye, and can be formed, for example, by a photolithography method, a printing method, an electrodeposition method, an electrophotographic method, or the like in the case of using a pigment. Here, the color layer is formed by an inkjet method, By using an inkjet method, the color layer can be formed at room temperature, can be formed at a low vacuum, or can be formed using a large substrate. Since the color layer can be formed without using a mask (reticle), costs and the number of steps can be reduced. Moreover, since a film is formed only where needed, a material is not wasted and costs can be reduced as compared to a manufacturing method in which etching is performed after a film is formed over the entire surface. Then, opening portions are provided in part of the color layer 518.

Next, as illustrated in FIG. 14B, the protective film 519 is formed over the color layer 518 and surfaces of the protective film 517, which are exposed by the opening portions in the color layer 518.

Figure 15A:
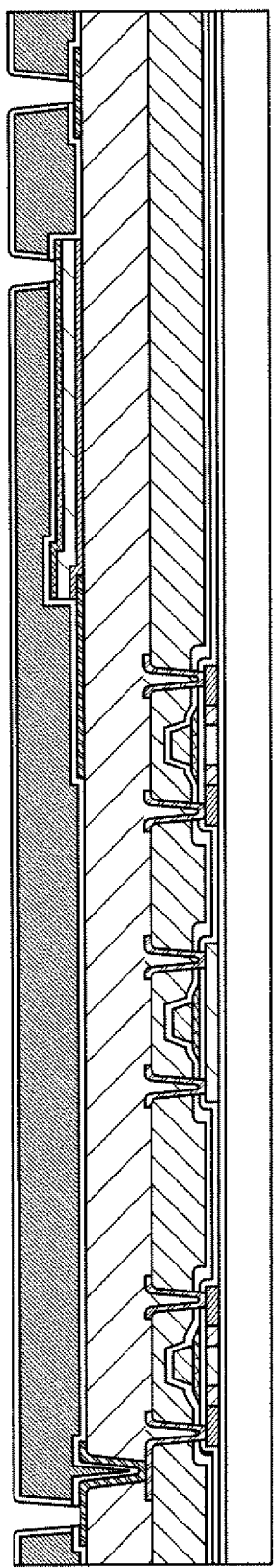
FIGS. 15A and 15B are cross-sectional views illustrating an example of a method for manufacturing a pixel in an image input-output device in Embodiment 3.

Then, as illustrated in FIG. 15A, the protective films 517 and 519 in the opening portions are removed by etching.

Figure 15B:
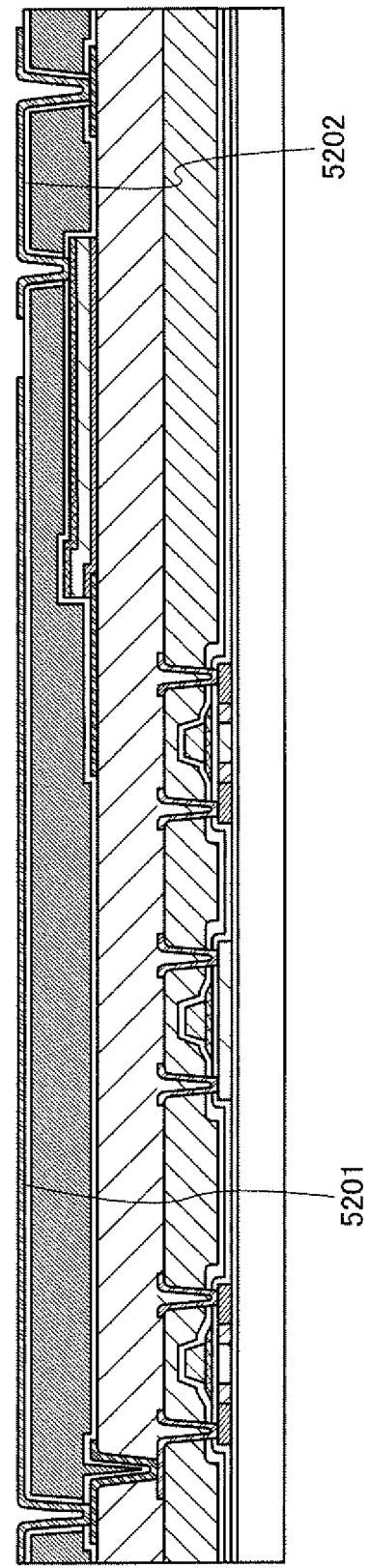

Next, as illustrated in FIG. 15B, the electrode 5201 is formed so as to be in contact with the electrode 5131 through an opening portion provided in the protective film 517, the color layer 518, and the protective film 519. Moreover, the electrode 5202 is formed so as to be in contact with the semiconductor layer 516 and the electrode 5133 through opening portions provided in the protective film 517, the color layer 518, and the protective film 519.

Figure 16:
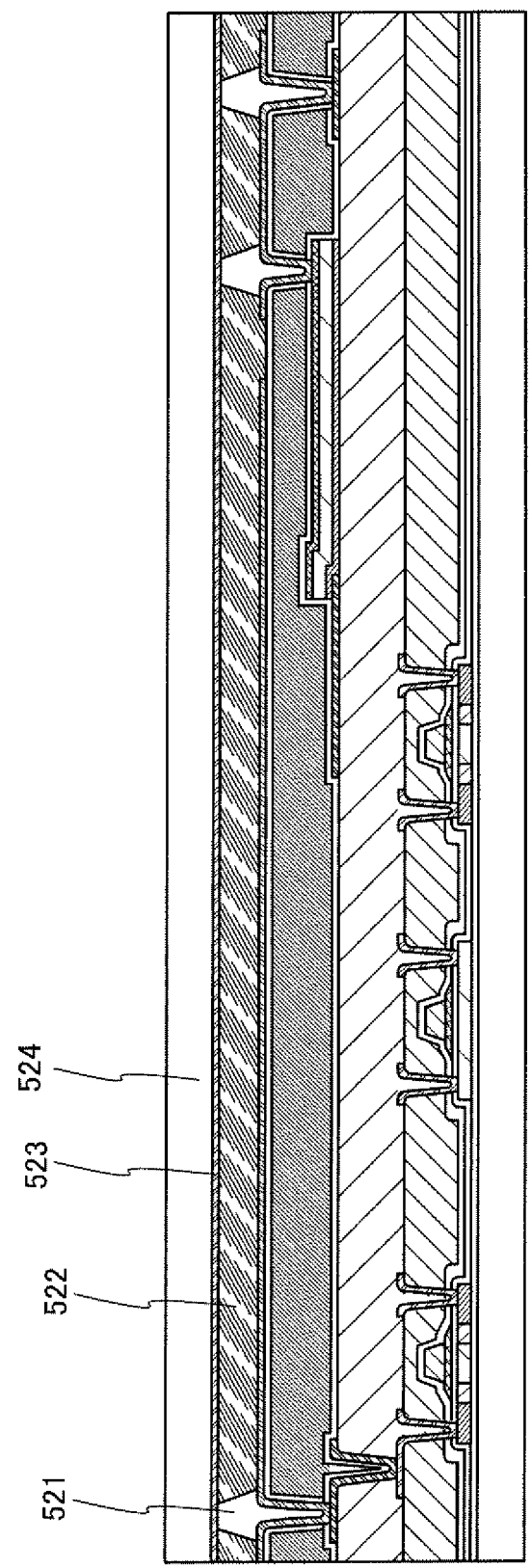
FIG. 16 is a cross-sectional view illustrating an example of a method for manufacturing a pixel in an image input-output device in Embodiment 3.

Then, as illustrated in FIG. 16, the partition layers 521 and the liquid crystal layer 522 are selectively formed over the electrodes 5201 and 5202, and the substrate 524 provided with the electrode 523 in advance is attached to the substrate 501.

Through the above steps, the image input-output device with the pixel structure illustrated in FIG. 5 can be formed. Note that a display circuit and a reading circuit can be formed over the same one substrate by the manufacturing method in this embodiment.

Note that this embodiment can be implemented in combination with other embodiments as appropriate.

(Embodiment 4)

In this embodiment, a method for manufacturing an image input-output device including a light blocking layer, which is one embodiment of the invention disclosed in this specification, will be described.

Figure 17A:
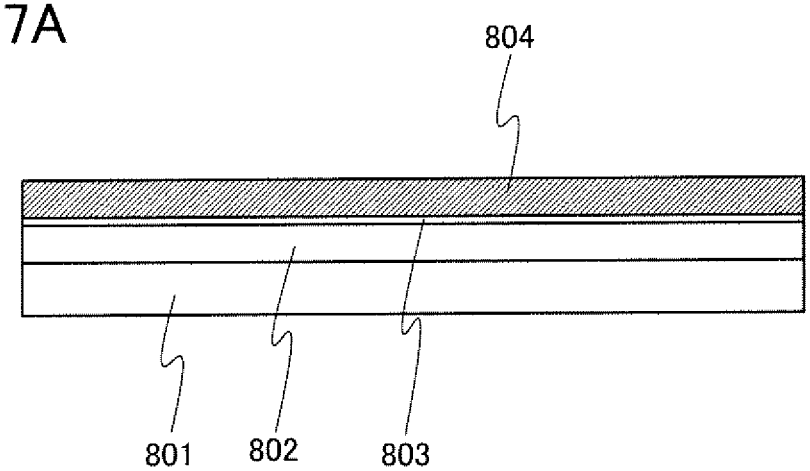
FIGS. 17A to 17C are cross-sectional views illustrating an example of a method for manufacturing a color layer and a light blocking layer in an image input-output device in Embodiment 4.
Figure 17B:
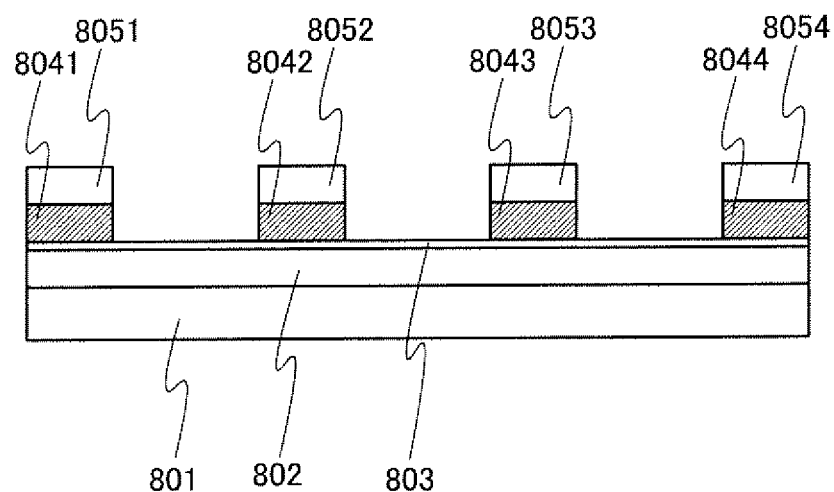
Figure 17C:
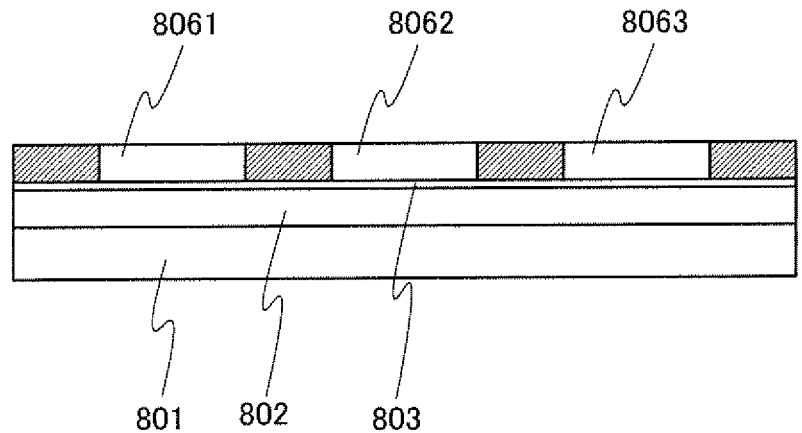

As has been illustrated in FIG. 7, a light blocking layer can be provided together with a color layer in one embodiment of the invention disclosed in this specification. A method for manufacturing an image input-output device including a light blocking layer will be described with reference to FIGS. 17A to 17C. FIGS. 17A to 17C are cross-sectional views illustrating an example of a method for manufacturing a color layer and a light blocking layer in this embodiment.

First, as illustrated in FIG. 17A, an element formation layer 802 is formed over a substrate 801. The element formation layer 802 corresponds to the element formation layer 503 in FIG. 5. Then, a protective film 803 is formed over the element formation layer 802. The protective film 803 corresponds to the protective film 517 in FIG. 5. Further, a light blocking film 804 is formed over the protective film 803.

Next, as illustrated in FIG. 17B, resist masks 8051 to 8054 are selectively formed over the light blocking film 804, and the light blocking film 804 is etched using the resist masks 8051 to 8054 as masks to form light blocking layers 8041 to 8044.

Then, as illustrated in FIG. 17C, color layers 8061 to 8063 are formed between the light blocking layers 8041 to 8044. The color layers 8061 to 8063 can be formed by an inkjet method, a photolithography method, or an electrodeposition method, for example. Further, the color layers 8061 to 8063 can be the same in color or can have different colors such as R, G, and B.

Through the above steps, the light blocking layer and the color layer can be formed. In the case of providing a light blocking layer and a color layer, the light blocking layers are formed first and the color layer is formed between the light blocking layers using the light blocking layers as partition layers as shown in this embodiment, whereby the color layer can be more easily formed.

Note that this embodiment can be implemented in combination with other embodiments as appropriate.

(Embodiment 5)

In this embodiment, an image input-output device including a driver circuit will be described as one embodiment of the invention disclosed in this specification.

Figure 18:
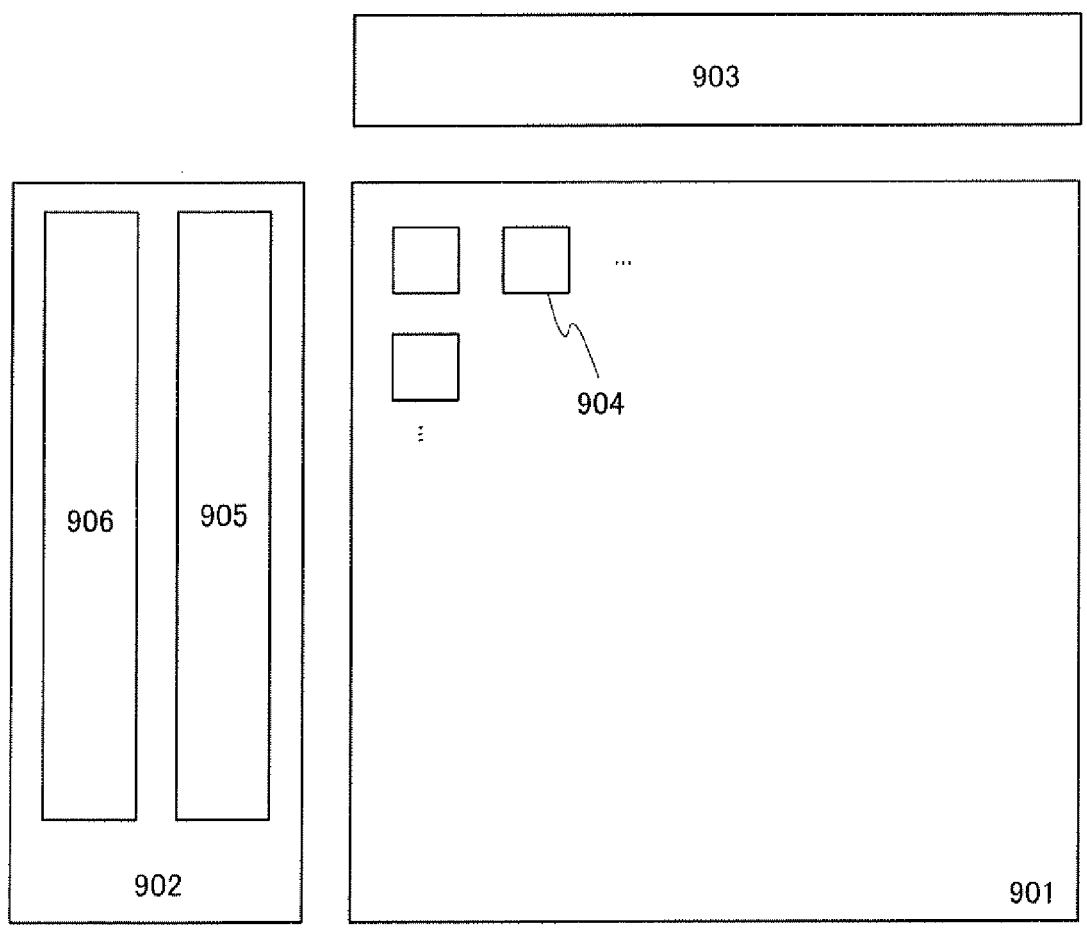
FIG. 18 is a block diagram illustrating an example of a structure of an image input-output device in Embodiment 5.

A structure of an image input-output device in this embodiment will be described with reference to FIG. 18. FIG. 18 is a block diagram illustrating an example of a structure of the image input-output device in this embodiment.

The image input-output device illustrated in FIG. 18 includes a pixel portion 901, a first driver circuit 902, and a second driver circuit 903.

The pixel portion 901 has a dot matrix structure including a plurality of pixels 904 arranged in the row and column directions. As the structure of the pixel 904, the structure of the pixel shown in the above embodiments can be used, for example.

The first driver circuit 902 is a circuit mainly for selecting a pixel where display and reading are performed, and includes a scan line driver circuit 905 and a potential control line driver circuit 906. Note that a plurality of first driver circuits 902 can be provided, for example, without limitation to the structure illustrated in FIG. 18.

The second driver circuit 903 has a function of outputting a data signal for display to the pixel 904 selected by the first driver circuit 902, and a function of storing image data read in the pixel 904.

Next, operation of the image input-output device in FIG. 18 will be described.

As has been described in the above embodiments, the operation of the image input-output device in FIG. 18 is classified into two periods of a display period and a read period. The operation in each period will be described below.

First, in the display period, the pixel 904 to which data is written is selected by the scan line driver circuit 905 in the first driver circuit 902, and a data signal is output from the second driver circuit 903 to the selected pixel 904, so that the selected pixel 904 enters into a display state. Further, the pixels 904 are selected per row by the first driver circuit 902, and data is written into all the pixels 904.

Next, in the read period, the pixel 904 where the illuminance of incident light is read is selected by the potential control line driver circuit 906 in the first driver circuit 902. In response to a signal input from the potential control line driver circuit 906, the selected pixel 904 outputs a data signal to the second driver circuit 903 in accordance with a current generated corresponding to the illuminance of incident light, whereby data of the illuminance of incident light is read. Further, the pixels 904 are selected per row by the second driver circuit 903, and illuminance data is read in all the pixels 904.

The display operation and the read operation are performed in the pixel portion as described above, so that an image input-output device can have a variety of functions such as a function of detecting position, a function of inputting and outputting text, and a function of inputting and outputting documents, which are described in the above embodiment.

Note that this embodiment can be implemented in combination with other embodiments as appropriate.

(Embodiment 6)

In this embodiment, an electronic device including the image input-output device, which is one embodiment of the invention disclosed in this specification, in a display portion will be described.

By applying the image input-output device, which is one embodiment of the invention disclosed in this specification, to a display portion of a variety of electronic devices, an electronic device having a variety of functions in addition to a display function can be provided. Specific examples of electronic devices to which the image input-output device, which is one embodiment of the invention disclosed in this specification, is applied will be described with reference to FIGS. 19A to 19F. FIGS. 19A to 19F each illustrate an example of a structure of an electronic device in this embodiment.

Figure 19A:
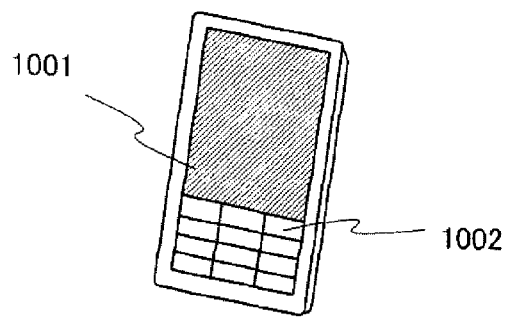
FIGS. 19A to 19F each illustrate an example of a structure of an electronic device including an image input-output device in Embodiment 6 in a display portion.

FIG. 19A illustrates a personal digital assistant. The personal digital assistant illustrated in FIG. 19A includes at least a display portion 1001. The image input-output device, which is one embodiment of the invention disclosed in this specification, can be placed in the display portion 1001. When the image input-output device, which is one embodiment of the invention disclosed in this specification, is placed in the display portion 1001, the personal digital assistant can be used in place of a variety of portable devices. For example, when the display portion 1001 is provided with an operation portion 1002 by using a position detection function, the personal digital assistant can be used as a mobile phone. Note that the operation portion 1002 is not necessarily provided in the display portion 1001, and additional operation buttons may be provided. Moreover, the personal digital assistant can be used as a notepad by using a text input-output function or used as a handy scanner by using a document input-output function.

Figure 19B:
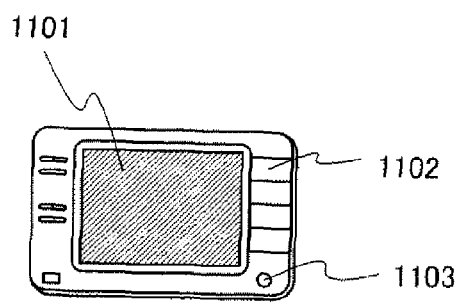

FIG. 19B illustrates an information guide terminal including an automotive navigation system, for example. The information terminal illustrated in FIG. 19B includes at least a display portion 1101, and can also include operation buttons 1102, an external input terminal 1103, and the like. The image input-output device, which is one embodiment of the invention disclosed in this specification, can be provided in the display portion 1101. When the image input-output device, which is one embodiment of the invention disclosed in this specification, is placed in the display portion 1101, the information guide terminal can be operated without touching a pixel portion, and thus can be operated more easily.

Figure 19C:
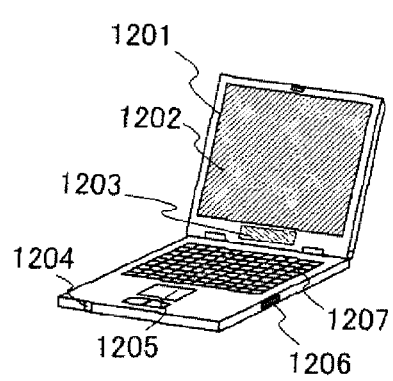

FIG. 19C illustrates a laptop personal computer. The laptop personal computer illustrated in FIG. 19C includes a housing 1201, a display portion 1202, a speaker 1203, an LED lamp 1204, a pointing device 1205, a connection terminal 1206, and a keyboard 1207. The image input-output device, which is one embodiment of the invention disclosed in this specification, can be provided in the display portion 1202. When the image input-output device, which is one embodiment of the invention disclosed in this specification, is placed in the display portion 1202, input operation can be performed using a text input-output function by directly writing letters on the display portion 1202. Further, the keyboard 1207 can be provided in the display portion 1202.

Figure 19D:
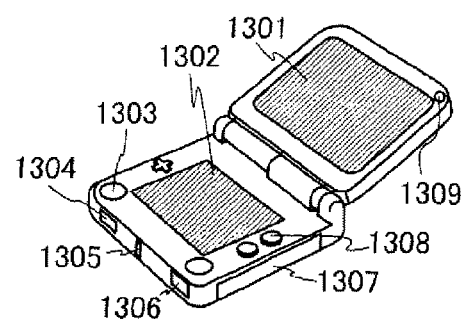

FIG. 19D illustrates a portable game machine. The portable game machine illustrated in FIG. 19D includes a first display portion 1301, a second display portion 1302, a speaker 1303, a connection terminal 1304, an LED lamp 1305, a microphone 1306, a recording medium reading portion 1307, operation buttons 1308, and a sensor 1309. The image input-output device, which is one embodiment of the invention disclosed in this specification, can be provided in one or both of the first display portion 1301 and the second display portion 1302. When the image input-output device, which is one embodiment of the invention disclosed in this specification, is placed in one or both of the first display portion 1301 and the second display portion 1302, the portable game machine can be operated without touching a pixel portion, and thus can be operated more easily with an input means (e.g., a finger or a pen).

Figure 19E:
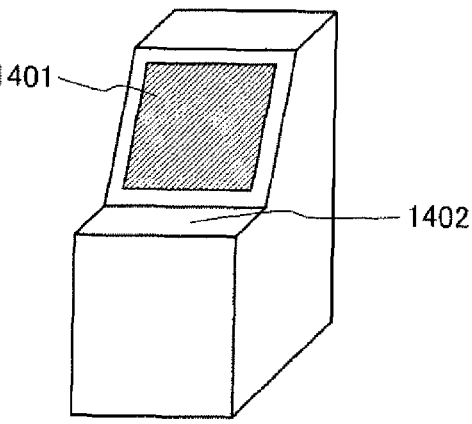

FIG. 19E illustrates a stationary information terminal. The stationary information terminal illustrated in FIG. 19E includes at least a display portion 1401. Note that the display portion 1401 can also be provided in a plane portion 1402. Moreover, additional operation buttons or the like can be provided for the plane portion 1402. The image input-output device, which is one embodiment of the invention disclosed in this specification, can be provided in the display portion 1401. When the image input-output device, which is one embodiment of the invention disclosed in this specification, is placed in the display portion 1401, the stationary information terminal can have a variety of functions and for example, can be used as an automated teller machine or an information terminal (also referred to as a multimedia station) for ordering information goods such as a ticket.

Figure 19F:
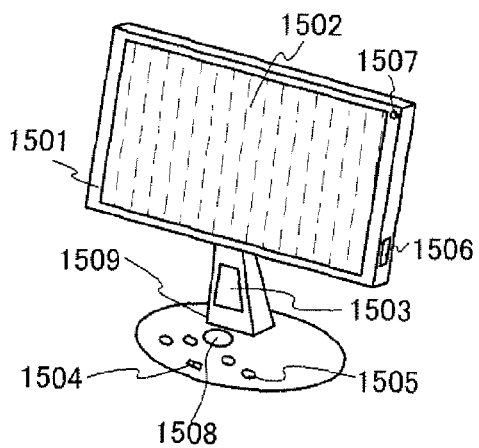

FIG. 19F illustrates a display. The display illustrated in FIG. 19F includes a housing 1501, a display portion 1502, a speaker 1503, an LED lamp 1504, operation buttons 1505, a connection terminal 1506, a sensor 1507, a microphone 1508, and a support base 1509. The image input-output device, which is one embodiment of the invention disclosed in this specification, can be provided in the display portion 1502. When the image input-output device, which is one embodiment of the invention disclosed in this specification, is placed in the display portion 1502, the display portion can have a variety of functions by combining a text input-output function, a position detection function, and a document input-output function.

As described above, by providing the image input-output device, which is one embodiment of the invention disclosed in this specification, in a display portion of an electronic device, a multifunctional electronic device can be provided.

Note that this embodiment can be implemented in combination with other embodiments as appropriate.

This application is based on Japanese Patent Application serial no. 2008-286043 filed with Japan Patent Office on Nov. 7, 2008, the entire contents of which are hereby incorporated by reference.

What is claimed is:
1. An image input-output device comprising:
a substrate; and
a pixel which is provided over the substrate, and configured to display an image and configured to read an image,
wherein the pixel includes:
a first transistor and a second transistor;
a photodetector element having an anode and a cathode, one of which is electrically connected to a gate electrode of the second transistor;
a first protective film provided over the first transistor, the second transistor, and the photodetector element;
a color layer and a light blocking layer provided over and in contact with a top surface of the first protective film, a top surface of the color layer being aligned with a top surface of the light blocking layer;
a second protective film provided over and in contact with a top surface of the color layer and a top surface of the light blocking layer; and
a liquid crystal element provided over the second protective film, and wherein the liquid crystal element includes:
a first electrode provided over and in contact with a top surface of the second protective film;
a second electrode; and
a liquid crystal layer to which a voltage is configured to be applied by the first electrode and the second electrode.

2. The image input-output device according to claim 1, wherein the photodetector element includes:
a first semiconductor layer having one of p-type conductivity and n-type conductivity;
a second semiconductor layer which is provided over the first semiconductor layer and has a higher resistance than the first semiconductor layer; and
a third semiconductor layer which is provided over the second semiconductor layer, and has the other of p-type conductivity and n-type conductivity and a lower resistance than the second semiconductor layer.

3. The image input-output device according to claim 1, wherein the photodetector element includes a semiconductor layer including a first semiconductor region having one of p-type conductivity and n-type conductivity; a second semiconductor region having a higher resistance than the first semiconductor region; and a third semiconductor region having the other of p-type conductivity and n-type conductivity and a lower resistance than the second semiconductor region.

4. The image input-output device according to claim 1, wherein the photodetector element generates a current in accordance with the illuminance of incident light through the color layer.

5. The image input-output device according to claim 1, wherein the color layer is a color layer of at least any of red, green, and blue.

6. The image input-output device according to claim 1, wherein the image input-output device has a function of inputting and outputting text.

7. The image input-output device according to claim 1, wherein the image input-output device is incorporated into an electronic device selected from the group consisting of a personal digital assistant, an information guide terminal, a laptop personal computer, a portable game machine, a stationary information terminal, and a display.

8. The image input-output device according to claim 1, wherein the substrate is a flexible substrate.

9. The image input-output device according to claim 1, wherein the photodetector element overlaps with the second transistor.

10. The image input-output device according to claim 1, wherein the first electrode overlaps with the photodetector element.

11. An image input-output device comprising:
a substrate; and
a pixel which is provided over the substrate, and configured to display an image and configured to read an image,
wherein the pixel includes:
a first transistor and a second transistor;
a photodetector element having an anode and a cathode, one of which is electrically connected to a gate electrode of the second transistor;
a first protective film provided over the first transistor, the second transistor, and the photodetector element;
a color layer and a light blocking layer having a tapered cross section provided over and in contact with a top surface of the first protective film, a top surface of the color layer being aligned with a top surface of the light blocking layer;

a second protective film provided over and in contact with a top surface of the color layer and a top surface of the light blocking layer; and a liquid crystal element provided over the second protective film, and wherein the liquid crystal element includes:

a first electrode provided over and in contact with a top surface of the second protective film;

a second electrode; and a liquid crystal layer to which a voltage is configured to be applied by the first electrode and the second electrode.

12. The image input-output device according to claim 11, wherein the photodetector element includes:

a first semiconductor layer having one of p-type conductivity and n-type conductivity;

a second semiconductor layer which is provided over the first semiconductor layer and has a higher resistance than the first semiconductor layer; and a third semiconductor layer which is provided over the second semiconductor layer, and has the other of p-type conductivity and n-type conductivity and a lower resistance than the second semiconductor layer.

13. The image input-output device according to claim 11, wherein the photodetector element includes a semiconductor layer including a first semiconductor region having one of p-type conductivity and n-type conductivity; a second semiconductor region having a higher resistance than the first semiconductor region; and a third semiconductor region having the other of p-type conductivity and n-type conductivity and a lower resistance than the second semiconductor region.

14. The image input-output device according to claim 11, wherein the photodetector element generates a current in accordance with the illuminance of incident light through the color layer.

15. The image input-output device according to claim 11, wherein the color layer is a color layer of at least any of red, green, and blue.

16. The image input-output device according to claim 11, wherein the image input-output device has a function of inputting and outputting text.

17. The image input-output device according to claim 11, wherein the image input-output device is incorporated into an electronic device selected from the group consisting of a personal digital assistant, an information guide terminal, a laptop personal computer, a portable game machine, a stationary information terminal, and a display.

18. The image input-output device according to claim 11, wherein the substrate is a flexible substrate.

19. The image input-output device according to claim 11, wherein the photodetector element overlaps with the second transistor.

20. The image input-output device according to claim 11, wherein the first electrode overlaps with the photodetector element.

21. The image input-output device according to claim 11, wherein the light blocking layer overlaps with the first transistor.

* * * * *